United States Patent
Song et al.

(10) Patent No.: US 10,667,440 B2
(45) Date of Patent: *May 26, 2020

(54) ELECTRIC VEHICLE INVERTER MODULE HEAT SINK

(71) Applicant: SF Motors, Inc., Santa Clara, CA (US)

(72) Inventors: Yunan Song, Santa Clara, CA (US); Colin Haag, Santa Clara, CA (US); Zhong Nie, Santa Clara, CA (US); Duanyang Wang, Santa Clara, CA (US); Yifan Tang, Santa Clara, CA (US)

(73) Assignee: SF MOTORS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/234,242

(22) Filed: Dec. 27, 2018

(65) Prior Publication Data

US 2019/0335608 A1 Oct. 31, 2019

Related U.S. Application Data

(63) Continuation of application No. 16/110,559, filed on Aug. 23, 2018.

(Continued)

(51) Int. Cl.
*H05K 7/20* (2006.01)
*B60L 58/10* (2019.01)

(52) U.S. Cl.
CPC .......... *H05K 7/209* (2013.01); *H05K 7/20854* (2013.01); *H05K 7/20872* (2013.01);
(Continued)

(58) Field of Classification Search
CPC ........... H05K 7/20872; H05K 7/20927; H05K 7/20854; H05K 7/209; B60L 11/1851;
(Continued)

(56) References Cited

U.S. PATENT DOCUMENTS

| 4,382,156 A | 5/1983 | Jodoin |
| 4,502,107 A | 2/1985 | Nilssen |

(Continued)

FOREIGN PATENT DOCUMENTS

| CN | 203850295 | 9/2014 |
| CN | 204442853 U | 7/2015 |

(Continued)

OTHER PUBLICATIONS

Non-Final Office Action on U.S. Appl. No. 16/051,182 dated Nov. 2, 2018.

(Continued)

*Primary Examiner* — Mandeep S Buttar
(74) *Attorney, Agent, or Firm* — Foley & Lardner LLP; James de Vellis

(57) ABSTRACT

Provided herein are a heat sink module of an inverter module to power an electric vehicle. The heats sink module can include a heat sink body having a plurality of mounting holes, a fluid inlet and a fluid outlet. The heats sink module can include a cooling channel that can be fluidly coupled with the fluid inlet and the fluid outlet. The heats sink module can include an insulator plate having a first surface and a second surface. The second surface of the insulator plate can couple with a joining surface of the heat sink body to seal the cooling channel. The heats sink module can include a heat sink lid disposed over the insulator plate. The heat sink lid can have a plurality of mounting feet to couple with the mounting holes of the heat sink body to secure the heat sink lid to the heat sink body.

18 Claims, 6 Drawing Sheets

Related U.S. Application Data

(60) Provisional application No. 62/663,192, filed on Apr. 26, 2018.

(52) U.S. Cl.
CPC .......... *H05K 7/20927* (2013.01); *B60L 58/10* (2019.02); *B60L 2210/00* (2013.01); *B60Y 2200/91* (2013.01); *B60Y 2306/05* (2013.01); *B60Y 2400/61* (2013.01)

(58) Field of Classification Search
CPC ............ B60L 2210/00; B60Y 2400/61; B60Y 2200/91; B60Y 2306/05
USPC ..... 361/699, 702, 714, 679.53, 679.54, 697, 361/722; 165/104.33, 80.2, 80.4
See application file for complete search history.

(56) References Cited

U.S. PATENT DOCUMENTS

| | | | |
|---|---|---|---|
| 4,584,768 A | 4/1986 | Tosti | |
| 5,365,424 A | 11/1994 | Deam et al. | |
| 5,371,043 A | 12/1994 | Anderson et al. | |
| 5,436,997 A | 7/1995 | Makiuchi et al. | |
| 5,514,906 A * | 5/1996 | Love | H01L 23/473 257/712 |
| 5,631,574 A | 5/1997 | Kazama | |
| 5,783,877 A | 7/1998 | Chitayat | |
| 5,804,761 A | 9/1998 | Donegan et al. | |
| 5,847,938 A | 12/1998 | Gammon | |
| 6,176,299 B1 * | 1/2001 | Hanzlik | H01L 23/467 165/121 |
| 6,822,850 B2 | 11/2004 | Pfeifer et al. | |
| 6,843,335 B2 | 1/2005 | Shirakawa et al. | |
| 7,046,535 B2 | 5/2006 | Rodriguez et al. | |
| 7,113,405 B2 | 9/2006 | Armstrong et al. | |
| 7,292,451 B2 | 11/2007 | Rodriguez et al. | |
| 7,505,294 B2 | 3/2009 | Ahmed et al. | |
| 7,551,439 B2 * | 6/2009 | Peugh | H01L 23/053 165/80.4 |
| 7,557,298 B2 | 7/2009 | Vanhoutte et al. | |
| 7,714,230 B2 | 5/2010 | Beulque | |
| 7,742,303 B2 | 6/2010 | Azuma et al. | |
| 7,742,307 B2 | 6/2010 | Ellsworth et al. | |
| 7,777,433 B2 | 8/2010 | Yamaguchi et al. | |
| 7,965,510 B2 | 6/2011 | Suzuki et al. | |
| 7,969,735 B2 | 6/2011 | Nakatsu et al. | |
| 8,059,404 B2 | 11/2011 | Miller et al. | |
| 8,391,008 B2 * | 3/2013 | Dede | H01L 23/4735 165/104.21 |
| 8,519,561 B2 | 8/2013 | Azuma et al. | |
| 8,773,007 B2 | 7/2014 | Van De Ven et al. | |
| 8,780,557 B2 | 7/2014 | Duppong et al. | |
| 8,888,506 B2 | 11/2014 | Nishimura et al. | |
| 8,947,899 B2 | 2/2015 | Savatski et al. | |
| 8,952,525 B2 | 2/2015 | Ide et al. | |
| 9,007,767 B2 | 4/2015 | Nakajima | |
| 9,247,697 B2 | 2/2016 | Chen et al. | |
| 9,439,332 B2 | 9/2016 | Ide et al. | |
| 9,578,788 B2 | 2/2017 | Tang et al. | |
| 9,647,361 B2 | 5/2017 | Kobuchi et al. | |
| 10,122,294 B2 | 11/2018 | Xu et al. | |
| 10,215,504 B2 | 2/2019 | Coteus et al. | |
| 10,236,786 B2 | 3/2019 | Liu et al. | |
| 10,236,791 B1 | 3/2019 | Chung et al. | |
| 10,263,407 B1 | 4/2019 | Song et al. | |
| 2003/0111714 A1 | 6/2003 | Bates et al. | |
| 2003/0133257 A1 * | 7/2003 | Beihoff | B60L 11/12 361/600 |
| 2003/0218057 A1 * | 11/2003 | Joseph | B23K 1/0012 228/183 |
| 2004/0060692 A1 * | 4/2004 | Pfeifer | H02M 7/003 361/704 |
| 2004/0227231 A1 | 11/2004 | Maly et al. | |
| 2004/0228094 A1 | 11/2004 | Ahmed et al. | |
| 2006/0092611 A1 * | 5/2006 | Beihoff | B60L 11/12 361/698 |
| 2006/0274561 A1 | 12/2006 | Ahmed et al. | |
| 2006/0291165 A1 | 12/2006 | Flesch et al. | |
| 2007/0236883 A1 * | 10/2007 | Ruiz | H01L 23/473 361/699 |
| 2007/0246351 A1 | 10/2007 | Smola et al. | |
| 2007/0252169 A1 | 11/2007 | Tokuyama et al. | |
| 2008/0247139 A1 * | 10/2008 | Stahlhut | H05K 1/0203 361/709 |
| 2008/0316710 A1 | 12/2008 | Seto et al. | |
| 2009/0129011 A1 * | 5/2009 | Balzano | H01L 23/473 361/689 |
| 2010/0025126 A1 * | 2/2010 | Nakatsu | B60L 11/00 180/65.1 |
| 2010/0026090 A1 | 2/2010 | Nakatsu et al. | |
| 2010/0277868 A1 * | 11/2010 | Beaupre | H01L 23/473 361/700 |
| 2010/0290190 A1 | 11/2010 | Chester et al. | |
| 2012/0325447 A1 | 12/2012 | You et al. | |
| 2013/0114210 A1 * | 5/2013 | Ebersberger | H01L 23/473 361/702 |
| 2013/0146253 A1 * | 6/2013 | Daly | H05K 7/20281 165/80.4 |
| 2013/0146254 A1 * | 6/2013 | Jeon | H05K 7/20927 165/104.11 |
| 2013/0235527 A1 * | 9/2013 | Wagner | H05K 1/0203 361/702 |
| 2014/0133150 A1 * | 5/2014 | Pardikes | F21V 21/005 362/249.02 |
| 2014/0262177 A1 | 9/2014 | Tang et al. | |
| 2014/0307389 A1 * | 10/2014 | Arvelo | B21D 53/04 361/702 |
| 2014/0345492 A1 * | 11/2014 | Fujito | H02P 27/06 105/61 |
| 2014/0347817 A1 * | 11/2014 | Joshi | H05K 7/20927 361/699 |
| 2014/0369099 A1 | 12/2014 | Asako | |
| 2015/0003019 A1 | 1/2015 | Ide et al. | |
| 2015/0021756 A1 * | 1/2015 | Adachi | H01L 23/473 257/714 |
| 2015/0289391 A1 | 10/2015 | Nakatsu et al. | |
| 2016/0155572 A1 | 6/2016 | Ramm et al. | |
| 2016/0156278 A1 | 6/2016 | Ramm et al. | |
| 2016/0183409 A1 * | 6/2016 | Zhou | H05K 7/20281 361/699 |
| 2016/0242312 A1 * | 8/2016 | Singh | H05K 1/111 |
| 2017/0028869 A1 | 2/2017 | Boddakayala et al. | |
| 2017/0330815 A1 * | 11/2017 | Mische | H01L 23/3675 |
| 2018/0184538 A1 | 6/2018 | Bayerer | |
| 2018/0184543 A1 * | 6/2018 | Ando | H01L 23/473 |
| 2018/0198378 A1 | 7/2018 | Xu et al. | |
| 2018/0206359 A1 | 7/2018 | McPherson et al. | |
| 2018/0330895 A1 | 11/2018 | Nagayoshi et al. | |
| 2019/0335607 A1 | 10/2019 | Song et al. | |
| 2019/0335608 A1 | 10/2019 | Song et al. | |

FOREIGN PATENT DOCUMENTS

| | | |
|---|---|---|
| CN | 106656021 A | 5/2017 |
| CN | 106848118 A | 6/2017 |
| CN | 107769604 A | 3/2018 |

OTHER PUBLICATIONS

Final Office Action on U.S. Appl. No. 16/110,475 dated Sep. 17, 2019 (17 pages).
Foreign Search Report on PCT Appln. Ser. No. PCT/CN2019/079350 dated Jul. 3, 2019 (9 pages).
Foreign Search Report on PCT Appln. Ser. No. PCT/CN2019/079352 dated Jun. 28, 2019 (11 pages).
International Search Report and Written Opinion for International Appl. No. PCT/CN2018/125644, dated Apr. 2, 2019 (9 pages).
International Search Report and Written Opinion for PCT/CN2019/079353 dated Jul. 1, 2019 (11 pages).

(56) References Cited

OTHER PUBLICATIONS

International Search Report and Written Opinion on PCT Appln. Ser. No. PCT/CN2018/125644 dated Apr. 2, 2019 (9 pages).
International Search Report and Written Opinion on PCT/CN2019/079350 dated Jul. 3, 2019 (11 pages).
International Search Report and Written Opinion on PCT/CN2019/079352 dated Jun. 8, 2019 (11 pages).
Non-Final Office Action on U.S. Appl. No. 16/110,513 dated May 13, 2019 (5 pages).
Notice of Allowance on U.S. Appl. No. 16/051,176 dated Jul. 31, 2019 (2 pages).
Notice of Allowance on U.S. Appl. No. 16/051,176 dated May 22, 2019 (9 pages).
Notice of Allowance on U.S. Appl. No. 16/051,176 dated Sep. 18, 2019 (9 pages).
Notice of Allowance on U.S. Appl. No. 16/051,190 dated Jul. 1, 2019 (10 pages).
Notice of Allowance on U.S. Appl. No. 16/051,193 dated Jul. 3, 2019 (11 pages).
Notice of Allowance on U.S. Appl. No. 16/051,991 dated Jun. 18, 2019 (6 pages).
Notice of Allowance on U.S. Appl. No. 16/051,991 dated May 20, 2019 (9 pages).
Notice of Allowance on U.S. Appl. No. 16/051,991 dated Sep. 18, 2019 (9 pages).
Notice of Allowance on U.S. Appl. No. 16/110,425 dated Jul. 30, 2019 (8 pages).
Notice of Allowance on U.S. Appl. No. 16/110,513 dated Sep. 4, 2019 (9 pages).
Notice of Allowance on U.S. Appl. No. 16/232,981 dated Aug. 13, 2019 (9 pages).
Notice of Allowance on U.S. Appl. No. 16/233,028 dated Jul. 3, 2019 (11 pages).
Notice of Allowance on U.S. Appl. No. 16/233,826 dated Jul. 31, 2019 (8 pages).
Notice of Allowance on U.S. Appl. No. 16/233,842 dated Sep. 18, 2019 (11 pages).
Non-Final Office Action on U.S. Appl. No. 16/051,190 dated Mar. 13, 2019.
Non-Final Office Action on U.S. Appl. No. 16/051,193 dated Apr. 9, 2019.
Non-Final Office Action on U.S. Appl. No. 16/110,425 dated Apr. 11, 2019.
Non-Final Office Action on U.S. Appl. No. 16/110,475 dated Mar. 13, 2019.
Non-Final Office Action on U.S. Appl. No. 16/110,559 dated Feb. 25, 2019.
Non-Final Office Action on U.S. Appl. No. 16/232,981 dated Mar. 13, 2019.
Non-Final Office Action on U.S. Appl. No. 16/233,028 dated Apr. 9, 2019.
Non-Final Office Action on U.S. Appl. No. 16/233,826 dated Apr. 11, 2019.
Non-Final Office Action on U.S. Appl. No. 16/233,642 dated Mar. 13, 2019.
Notice of Allowance on U.S. Appl. No. 16/051,182 dated Jan. 3, 2019.
Notice of Allowance on U.S. Appl. No. 16/234,238 dated Feb. 20, 2019.
Notice of Allowance on U.S. Appl. No. 16/051,176 dated Jan. 22, 2020 (10 pages).
Notice of Allowance on U.S. Appl. No. 16/051,991 dated Jan. 22, 2020 (10 pages).
Notice of Allowance on U.S. Appl. No. 16/110,425 dated Jan. 16, 2020 (8 pages).
Notice of Allowance on U.S. Appl. No. 16/233,028 dated Jan. 16, 2020 (9 pages).
Notice of Allowance on U.S. Appl. No. 16/233,826 dated Jan. 30, 2020 (9 pages).
Final Office Action on U.S. Appl. No. 16/110,559 dated Dec. 26, 2019 (18 pages).
Notice of Allowance on U.S. Appl. No. 16/051,190 dated Nov. 26, 2019 (2 pages).
Notice of Allowance on U.S. Appl. No. 16/051,190 dated Nov. 7, 2019 (10 pages).
Notice of Allowance on U.S. Appl. No. 16/051,193 dated Jan. 10, 2020 (9 pages).
Notice of Allowance on U.S. Appl. No. 16/110,475 dated Nov. 22, 2019 (8 pages).
Notice of Allowance on U.S. Appl. No. 16/110,513 dated Jan. 2, 2020 (9 pages).
Notice of Allowance on U.S. Appl. No. 16/110,513 dated Oct. 17, 2019 (2 pages).
Notice of Allowance on U.S. Appl. No. 16/232,981 dated Dec. 17, 2019 (10 pages).
Notice of Allowance on U.S. Appl. No. 16/233,842 dated Dec. 20, 2019 (4 pages).
Notice of Allowance on U.S. Appl. No. 16/233,842 dated Nov. 20, 2019 (8 pages).

\* cited by examiner

ELECTRIC VEHICLE INVERTER MODULE HEAT SINK

CROSS REFERENCE TO RELATED APPLICATIONS

The present application claims the benefit of priority under 35 U.S.C. § 120 as a continuation of U.S. patent application Ser. No. 16/110,559, filed Aug. 23, 2018 and titled "ELECTRIC VEHICLE INVERTER MODULE HEAT SINK," which claims the benefit of priority under 35 U.S.C. § 119(e) to U.S. Provisional Application 62/663,192, filed on Apr. 26, 2018, titled "ELECTRIC VEHICLE INVERTER MODULE HEAT SINK," each of which is incorporated herein by reference in its entirety.

BACKGROUND

Batteries can include electrochemical materials to supply electrical power to various electrical components connected thereto. Such batteries can provide electrical energy to various electrical systems.

SUMMARY

Systems and methods described herein relate to a multiple phase inverter module formed having three power modules (which can also be referred to herein as half-bridge modules, half-bridge inverter modules or sub-modules) arranged for example in a triplet configuration for electric vehicle drive systems. Each of the power modules can include at least one heat sink module to provide active cooling to other components (e.g., capacitor, transistors) within the respective power module. The inverter module can be coupled with a drive train unit of an electric vehicle and can provide three phase voltages to the drive train unit. For example, each of the power modules can generate a single phase voltage and thus, the three half-bridge modules arranged in a triplet configuration can provide three phase voltages.

At least one aspect is directed to a heat sink module of an inverter module to power an electric vehicle. The heat sink module can include a heat sink body having a plurality of mounting holes, a fluid inlet and a fluid outlet. The heat sink module can include a cooling channel formed in the heat sink body. The cooling channel can be fluidly coupled with the fluid inlet and the fluid outlet. The heat sink module can include an insulator plate coupled with the heat sink body. The insulator plate can have a first surface and a second surface. The second surface of the insulator plate can couple with a joining surface of the heat sink body to seal the cooling channel. The heat sink module can include a heat sink lid disposed over the first surface of the insulator plate. The heat sink lid can have a plurality of mounting feet to couple with the mounting holes of the heat sink body to secure the heat sink lid to the heat sink body.

At least one aspect is directed to a method of providing a heat sink module of an inverter module to power an electric vehicle. The method can include providing a heat sink body of a heat sink module. The method can include forming a plurality of mounting holes, a fluid inlet and a fluid outlet in the heat sink body. The method can include forming one or more cooling channels in the heat sink body. The cooling channels can be fluidly coupled with the fluid inlet and the fluid outlet. The method can include coupling an insulator plate with the heat sink body. The insulator plate can have a first surface and a second surface. The first surface can correspond to a cooling surface. The second surface of the insulator plate can couple with a joining surface of the heat sink body and seal the one or more cooling channels. The method can include disposing a heat sink lid over the first surface of the insulator plate. The heat sink lid can have a plurality of mounting feet to couple with the mounting holes of the heat sink body to secure the heat sink lid to the heat sink body.

At least one aspect is directed to a method. The method can include providing a heat sink module of an inverter module to power an electric vehicle. The heat sink module can include a heat sink body having a plurality of mounting holes, a fluid inlet and a fluid outlet. The heat sink module can include a cooling channel formed in the heat sink body. The cooling channel can be fluidly coupled with the fluid inlet and the fluid outlet. The heat sink module can include an insulator plate coupled with the heat sink body. The insulator plate can have a first surface and a second surface. The second surface of the insulator plate can couple with a joining surface of the heat sink body to seal the cooling channel. The heat sink module can include a heat sink lid disposed over the first surface of the insulator plate. The heat sink lid can have a plurality of mounting feet to couple with the mounting holes of the heat sink body to secure the heat sink lid to the heat sink body.

At least one aspect is directed to an electric vehicle. The electric vehicle can include a heat sink module for an inverter module of an electric vehicle. The heat sink module can include a heat sink body having a plurality of mounting holes, a fluid inlet and a fluid outlet. The heat sink module can include a cooling channel formed in the heat sink body. The cooling channel can be fluidly coupled with the fluid inlet and the fluid outlet. The heat sink module can include an insulator plate coupled with the heat sink body. The insulator plate can have a first surface and a second surface. The second surface of the insulator plate can couple with a joining surface of the heat sink body to seal the cooling channel. The heat sink module can include a heat sink lid disposed over the first surface of the insulator plate. The heat sink lid can have a plurality of mounting feet to couple with the mounting holes of the heat sink body to secure the heat sink lid to the heat sink body.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustration and a further understanding of the various aspects and implementations, and are incorporated in and constitute a part of this specification.

BRIEF DESCRIPTION OF THE DRAWINGS

The accompanying drawings are not intended to be drawn to scale. Like reference numbers and designations in the various drawings indicate like elements. For purposes of clarity, not every component can be labeled in every drawing. In the drawings.

DETAILED DESCRIPTION

Following below are more detailed descriptions of various concepts related to, and implementations of heat sink modules for battery packs in electric vehicles. The various concepts introduced above and discussed in greater detail below can be implemented in any of numerous ways.

Systems and methods described herein relate to a heat sink module (or heat sink) of an inverter module of a drive train unit of an electric vehicle. The drive train unit of an electric vehicle can include one or more inverter modules. For example, the drive train unit can include a multiple phase inverter module formed having three power modules (which can also be referred to herein as half-bridge modules, half-bridge inverter modules or sub-modules) arranged for example in a triplet configuration for electric vehicle drive systems. Each of the power modules can include at least one heat sink to provide active cooling to electrical components, such as but not limited to, a capacitor or transistors within the respective power module. The multiple phase inverter module can be coupled with a drive train unit of an electric vehicle and can provide three phase voltages to the drive train unit. For example, each of the power modules can generate a single phase voltage and thus, the three power modules arranged in a triplet configuration can provide three phase voltages.

Figure 1:
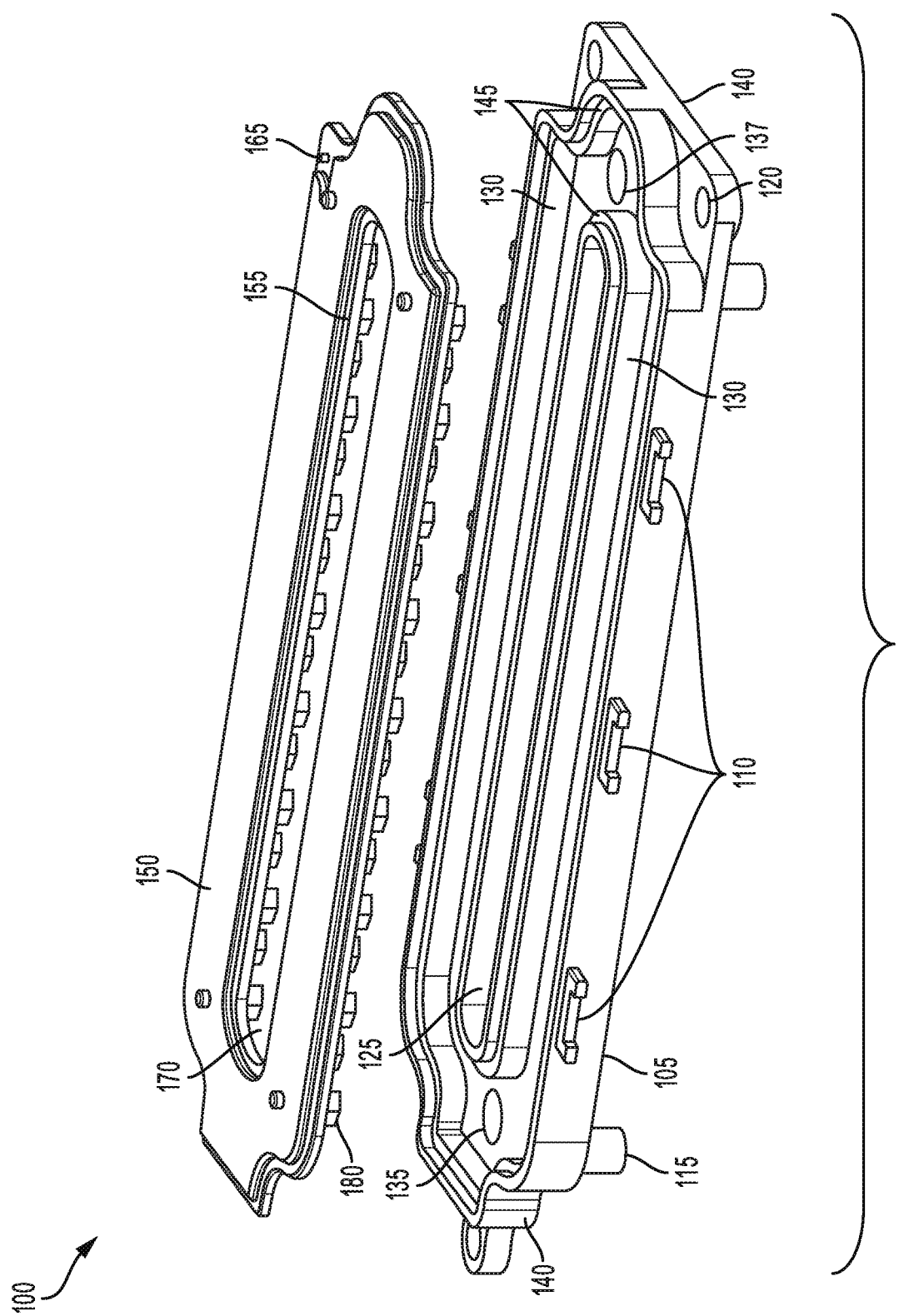
FIG. 1 depicts an example view of a lid portion of a heat sink of an inverter module of a drive unit of an electric vehicle; according to an illustrative implementation.

FIG. 1, among others, depicts a heat sink module 100. The heat sink module 100 can be a component of a power module (e.g., power module 300 as in the example of FIG. 3) that is disposed within an inverter module (e.g., inverter module 450 as in the example of FIG. 4) of a drive train unit of an electric vehicle (e.g., electric vehicle 405 as in the example of FIG. 4). For example, the heat sink module 100 can be a component of a single phase power module that is coupled with two other single phase power modules to form a three phase inverter module of a drive train unit of an electric vehicle. The heat sink module 100 can provide active cooling to the other components, such as electrical components (e.g., capacitor, transistors) of a power module. For example, the components of the power module, including but not limited to transistors, capacitors, bus bars may not have sufficient or effective cooling. Further, unreliable sealing of coolant may cause electrical shorts and the cooling components can be expensive to manufacture or hard to scale for mass production. The heat sink modules 100 described herein can provide cooling (e.g., active cooling, passive cooling) to the electrical components or electrical elements of the power module. For example, the heat sink module 100 can be positioned or disposed within a power module such that it is in contact with electrical components such as, but not limited to, a capacitor or transistors of the respective power module. The heat sink module 100 can include sealing surfaces or sealing components to provide reliable sealing of coolant used to cool the electrical components or electrical elements of a power module and the sealing surfaces or sealing components can be scaled for mass production and less expensive to manufacture. For example, the heat sink module 100 can provide active cooling to transistors, capacitors, bus bars (e.g., positive bus bar, negative bus bar, phase bus bar), and any electrical components or elements disposed about or surrounding the transistors, capacitors, and bus bars of the respective power module.

The heat sink module 100, including a heat sink lid (e.g., heat sink lid 200 as in the example of FIG. 2), an insulator plate (e.g., insulator plate 150 as in the example of FIG. 1) and a heat sink body (e.g., heat sink body 105 as in the example of FIG. 1), can have a length in a range from 200 mm to 225 mm (e.g., 215 mm). A height of the heat sink module 100, including a heat sink lid (e.g., heat sink lid 200 as in the example of FIG. 2), an insulator plate (e.g., insulator plate 150 as in the example of FIG. 1) and a heat sink body (e.g., heat sink body 105 as in the example of FIG. 1), can range from 10 mm to 20 mm (e.g., 13 mm). A width of the heat sink module 100, including a heat sink lid (e.g., heat sink lid 200 as in the example of FIG. 2), an insulator plate (e.g., insulator plate 150 as in the example of FIG. 1) and a heat sink body (e.g., heat sink body 105 as in the example of FIG. 1), can range from 45 mm to 65 mm (e.g., 52 mm). The length, height, and width of the heat sink module 100 can vary within or outside these ranges. The heat sink module 100 can include a variety of different materials, such as but not limited to, conductive material, metal material, metallic material or aluminum.

The heat sink module 100 can include a heat sink body 105. The heat sink body 105 can have a length in a range from 200 mm to 225 mm (e.g., 215 mm). A height of the heat sink body 105 can range from 5 mm to 20 mm (e.g., 10 mm). A width of the heat sink body 105 can range from 45 mm to 65 mm (e.g., 52 mm). The length, height, and width of the heat sink body 105 can vary within and outside these ranges. The heat sink body 105 can include a variety of different materials, such as but not limited to, conductive material, metal material, metallic material or aluminum. The heat sink body 105 can include a plurality of connection points 110. The connection points 110 can be formed on one or more surfaces of the heat sink body 105. For example, the connection points 110 can be formed on side surfaces of the heat sink body 105 to couple the heat sink body 105 with a heat sink lid (e.g., lid body 205 as in the example of FIG. 2). The heat sink body 105 can include a single connection point 110 or multiple connection points 110. For example, the heat sink body 105 can include a first plurality of connection points 110 formed on a first side surface of the heat sink body 105 and a second plurality of connection points 110 formed on a second side surface of the heat sink body 105. The second side surface can be an opposite or opposing side surface as compared to the first side surface. The number of connection points 110 formed on the different surfaces of the heat sink body 105 can be selected to correspond to the number of connection points 110 formed on corresponding surfaces of a heat sink lid (e.g., lid body 205 as in the example of FIG. 2). For example, the heat sink body 105 can have the same number of connection points 110 as the heat sink lid. The connection points 110 can be formed from a variety of different materials, including but not limited to, plastic material or non-conductive material.

The heat sink body 105 can include a plurality of mounting feet 115 (e.g., mounting boss). The mounting feet 115 can include a variety of different materials, including but not limited to, plastic material or non-conductive material. The mounting feet 115 can couple with mounting holes or other forms of connection points of other components of an inverter module. For example, the mounting feet 115 can be arranged or positioned along a surface (e.g., bottom surface, top surface) of the heat sink body 105. The mounting feet 115 can extend perpendicular with respect to a surface (e.g., bottom surface, top surface) of the heat sink body 105 to couple with corresponding mounting holes formed in other components of an inverter module, for example, but not limited to, mounting holes formed in a capacitor or capacitor frame. The mounting feet 115 can have a round shape, circular shape, octagonal shape, or rectangular shape. The mounting feet 115 can have a threaded outer surface to couple with a threaded inner surface of, for example, mounting holes. The mounting feet 115 can have a smooth outer surface to couple with an inner surface of, for example, mounting holes. The mounting feet 115 can have a variety of different shapes, sizes or dimensions and the shape, size or dimensions of a particular mounting feet 115 can be selected based at least in part on the dimensions of the lid body 205 or the heat sink body 105. The heat sink body 105 can include a single mounting foot 115 or multiple mounting feet 115. For example, the number of mounting feet 115 can be selected to correspond to the number of connection points or mounting holes on other components of the inverter module, such as but not limited to, a capacitor. For example, the number of mounting feet 115 formed on the heat sink body 105 can be the same as the number of mounting holes formed on a capacitor of an inverter module. The mounting feet 115 can couple with mounting holes or other forms of connection points on a gel tray (e.g., plastic gel tray). For example, a gel tray or insulation layer can be disposed over or coupled with the heat sink module 100 and the mounting feet 115 can couple with mounting holes on the gel tray to secure the gel tray with the heat sink module 100.

The heat sink body 105 can include a plurality of mounting holes 120. The mounting holes 120 can couple with, receive, engage, or secure the heat sink body 105 with mating parts (e.g., mounting feet) or connection points on other components of an inverter module, for example, of a heat sink lid (e.g., lid body 205 as in the example of FIG. 2). The mounting holes 120 can couple with or secure a transistor locator (e.g., plastic IGBT locator) to the heat sink body 105 and thus, to the heat sink module 100 during a manufacture process. For example, the transistor locator can position one or more transistors within an inverter module and the transistor locator can be coupled with the heat sink module 100 through one or more mounting holes 120 during the installation of the transistors.

The mounting holes 120 may include holes, orifices, or hollow portions formed through one or more portions of the heat sink body 105. The mounting holes 120 can be formed completely though a portion of the heat sink body 105 or may be formed up to a certain depth into a surface of the heat sink body 105. The mounting holes 120 may include a threaded inner surface to receive or engage a threaded outer surface of a fastener, screw, bolt, or mounting feet. The mounting holes 120 may include a threaded inner surface to receive or engage a threaded outer surface of a fastener, screw, bolt, or mounting feet. The mounting holes 120 can have a round shape, circular shape, octagonal shape, or rectangular shape. The mounting holes 120 can have a variety of different shapes, sizes or dimensions and the shape, size or dimensions of a particular mounting hole 120 can be selected based at least in part on the dimensions of the heat sink body 105. The heat sink body 105 can include a single mounting hole 120 or multiple mounting holes 120. For example, the number of mounting holes 120 can be selected to correspond to the number of connection points or mounting feet of other components of the inverter module, such as but not limited to, a heat sink lid body (lid body 205 as in the example of FIG. 2). For example, the number of mounting holes 120 formed on the heat sink body 105 can be the same as the number of mounting feet or connection points formed on a heat sink lid body of an inverter module.

The heat sink body 105 can include an open inner region 125. The open inner region 125 can be arranged such that portions of other components of an inverter module can be disposed within or through the open inner region 125 to provide additional cooling to the respective components. For example, portions of a capacitor, such as but not limited to, positive terminals or leads and negative terminals or leads, can be disposed within or extend through the open inner region 125. As the open inner region 125 of the heat sink body 105 can be disposed about, disposed around or otherwise surround the positive terminals or leads and negative terminals or leads of the capacitor, the open inner region 125 can provide active cooling to these components. The open inner region 125, in additional to other cooling components of the heat sink module 100, can reduce an inductance value of the inverter module and reduce EMI noise within the inverter module. For example, the design, shape, or geometry of the open inner region 125 can allow coolant fluid disposed within the heat sink module 100 (e.g., cooling channels) to be positioned adjacent to, proximate to or otherwise closer to the positive terminals or leads and negative terminals or leads of the capacitor to provide active cooling. The width of the open inner region 125 can range from 10 mm to 20 mm (e.g., 12 mm). The length of the open inner region 125 can range from 140 mm to 160 mm (e.g., 150 mm). The height of depth of the inner region 125 can range from 3 mm to 15 mm (e.g., 4 mm, 8 mm). The width, length, or height of the open inner region 125 can vary within or outside these ranges.

The heat sink body 105 can include at least one cooling channel 130. The cooling channel 130 can hold or contain fluid, such as coolant, to provide active cooling to other components of an inverter module, such as but not limited to, a capacitor or transistors. The cooling channel 130 can extend a length of the heat sink body 105. The cooling channel 130 can form an inner area or interior of the heat sink body 105. For example, the heat sink body 105 can include or have a shape that defines one or more cooling channels 130 (e.g., U shape or hollowed out inner portion). The cooling channel 130 can have a width in a range of about 15 mm to about 25 mm (e.g., 20 mm). The cooling channel 130 can have a height or depth in a range of 4 mm to 5 mm (e.g., 4.5 mm). The cooling channel 130 can have a length 190 mm to 210 mm. The width, height, depth, or length of the cooling channel 130 can vary within and outside these ranges.

The heat sink body 105 can include a single cooling channel 130 or multiple cooling channels 130 (e.g., two or more cooling channels 130). For example, the heat sink body 105 may include a first cooling channel 130 and a second cooling channel 130. The first cooling channel 130 and the second cooling channel 130 can be fluidly coupled such that the first cooling channel 130 and the second cooling channel 130 form one cooling channel and refer to portions or regions of the single cooling channel 130 disposed parallel with respect to each other. The first cooling channel 130 and the second cooling channel 130 can be separate cooling channels and form separate compartments or regions within the heat sink body 105. For example, the first cooling channel 130 and the second cooling channel 130 can have a common, unique or different inputs to receive fluid (e.g., coolant fluid) and outputs to release or discharge fluid. The heat sink body 105 may include one or more heat fins. The heat fins can provide cooling and thermal dissipation. The heat fins can include an extended surface or an extended surface area formed in the cooling channel 130 to provide more surface area for fluid disposed within the cooling channel 130 to flow over or around and thus provide a greater amount of cooling. The density, thickness, shape or dimensions of the cooling fins can be selected based at least in part on dimensions of the heat sink body and pressure parameters within the heat sink module 100. For example, the cooling fins density, shape or dimensions can be selected or optimized to provide cooling while maintaining relative low pressure drop.

The heat sink body 105 can include at least one fluid inlet 135. The fluid inlet 135 can include an orifice formed in the heat sink body 105 to receive or provide fluids to one or more cooling channels 130. For example, the fluid inlet 135 can receive coolant fluid and provide the fluid to at least one cooling channel 130. The heat sink body 105 can include a single fluid inlet 135 or multiple fluid inlets 135. For example, the heat sink body 105 can include at least one fluid inlet 135 for each cooling channel 130. The heat sink body 105 can include at least one fluid outlet 137. The fluid outlet 137 can include an orifice formed in the heat sink body 105 to release or discharge fluid from one or more cooling channels 130. For example, the fluid outlet 137 can release coolant fluid from at least one cooling channel 130. The heat sink body 105 can include a single fluid outlet 137 or multiple fluid outlets 137. For example, the heat sink body 105 can include at least one fluid outlet 137 for each cooling channel 130. The fluid inlet 135 can be the same as the fluid outlet 137. For example, the heat sink body 105 can include a single orifice that operates as both a fluid inlet 135 and a fluid outlet 137. The fluid inlet 135 can be formed at a first end of the heat sink body 105 and the fluid outlet 137 can be formed at a second, different end of the heat sink body 105. For example, the first end can be an opposite or opposing end of the heat sink body 105 as compared to the first end. The fluid inlet 155 and the fluid outlet 155 can be formed at the same end or portion of the heat sink body 105.

The heat sink body 105 can include at least one sealing surface 140. The sealing surface 140 can receive or engage with a surface (e.g., bottom surface, top surface) of other components of an inverter module. For example, the sealing surface 140 can couple with a surface of a capacitor module of the inverter module. The sealing surface 140 can form a seal with the surface of the other components of an inverter module that the heat sink module 100 is coupled with. The sealing surface 140 can include a smooth surface to couple with other components of an inverter module that the heat sink module 100 is coupled with. The sealing surface 140 can include a grooved surface to couple with other components of an inverter module that the heat sink module 100 is coupled with. For example, the sealing surface 140 can include one or more ridges or a threaded surface to couple with a grooved surface of another component of the inverter module that the heat sink module 100 is coupled with. The sealing surface 140 can correspond to a bottom surface of the heat sink body 105, and thus the heat sink module 100.

The heat sink body 105 can include at least one joining surface 145. The joining surface 145 can receive or engage with a surface (e.g., bottom surface, top surface) of an insulator plate of the heat sink module 100 (e.g., insulator plate 130). The joining surface 145 can form a seal with a surface of the insulator plate 130. For example, the joining surface 145 can form a seal with a bottom surface of the insulator plate 130 to seal the cooling channel 130. The joining surface 145 can include a ribbed edge or shaped edge to form the seal with the bottom surface of the insulator plate 130. The heat sink body 105 can include a first joining surface 145 and a second joining surface 145. For example, and as depicted in FIG. 1, the first joining surface 145 can form an edge or lip of an outer wall or outer perimeter of the cooling channel 130. The second joining surface 145 can form an edge or lip of an inner wall or inner perimeter of the cooling channel 130. Thus, the first and second joining surfaces 145 can seal the cooling channel 130 of the heat sink body 105 when the heat sink body 105 is coupled with the insulator plate 130.

The heat sink module 100 can include at least one insulator plate 150. The insulator plate 150 can couple with the heat sink body 105 to seal the cooling channel 130 and form a top surface of the cooling channel 130. For example, the insulator plate 150 can be disposed on, coupled with or in contact with the joining surfaces 145 of the heat sink body 105 such that the insulator plate 150 seals the cooling channel 130 of the heat sink body 150. The insulator plate 150 can be disposed or arranged such that it can provide thermal dissipation to components disposed about it, disposed above it, disposed below it, disposed adjacent to it, or disposed proximate to it. The insulator plate 150 can be disposed between the heat sink body 105 and a heat sink lid (e.g., heat sink lid 200 of the example of FIG. 2). The insulator plate 150 can have a length in a range from 200 mm to 225 mm (e.g., 215 mm). A height of the insulator plate 150 can range from 2 mm to 10 mm. A width of the insulator plate 150 can range from 45 mm to 65 mm (e.g., 52 mm). The length, height, and width of the insulator plate 150 can vary within and outside these ranges. The insulator plate 150 can include a variety of different materials, such as but not limited to, conductive material, metal material, metallic material or aluminum.

The insulator plate 150 can include at least one cooling surface 155. The cooling surface 155 can correspond to a top surface of the insulator plate. The cooling surface 155 can correspond to a top surface of the cooling channel 130. The cooling surface 155 can include or have a temperate corresponding to a temperature of the coolant fluid within the cooling channel 130. The cooling surface 155 can have or include a raised surface that extends into a bottom surface of an heat sink lid to couple the insulator plate 150 with the heat sink lid (e.g., heat sink lid 200 as in the example of FIG. 2).

The insulator plate 150 can include at least one extended surface 160. The insulator plate 150 can include a single extended surface 160 or multiple extended surfaces 160. The extended surfaces 160 can provide cooling and thermal dissipation by providing more surface area for fluid disposed within the cooling channel 130 to flow over or around and thus provide a greater amount of cooling. For example, the extended surfaces 160 can extend into the cooling channel 130 and interact with the fluid (e.g., coolant fluid) flowing through or disposed within the cooling channels 130. The density, thickness, shape or dimensions of the extended surfaces 160 can be selected based at least in part on dimensions of the insulator plate 150 or the dimensions of the cooling channel 150. The extended surfaces 160 can have a length in a range from 5 mm to 10 mm (e.g., 6.5 mm). The extended surfaces 160 can have a width in a range from 2 mm to 5 mm (e.g., 2.2 mm). The extended surfaces 160 can have a height in a range from 2 mm to 15 mm (e.g., 3.7 mm). The number of extended surfaces 160 coupled with or formed on the insulator plate 150 can vary from 80 to 250. The length, width, and height of the extended surfaces 160 can vary within or outside these ranges. The number of extended surfaces 160 coupled with or formed on the insulator plate 150 can vary within or outside this range. The locating pins 165 can have a length in a range from 5 mm to 10 mm (e.g., 6.5 mm). The locating pins 165 can have a width in a range from 2 mm to 5 mm (e.g., 2.2 mm). The locating pins 165 can have a height in a range from 2 mm to 15 mm (e.g., 3.7 mm). The number of locating pins 165 coupled with or formed on the insulator plate 150 can vary from 80 to 250. The length, width, and height of the locating pins 165 can vary within or outside these ranges. The number of locating pins 165 coupled with or formed on the insulator plate 150 can vary within or outside this range.

The insulator plate 150 can include at least one locating pin 165. The insulator plate 150 can include a single locating pin 165 or multiple locating pins 165. For example, the insulator plate 150 can include a plurality of locating pins 165 (e.g., locating dowels) to position the insulator plate 150 during a manufacturing process. The locating pins 165 can be used, for example, during a pick and place automation process, to increase an efficiency of the manufacture process. The locating pins 165 can be used to reduce the amount of human interaction with a particular manufacture process and therefore, the heat sink module 100 can be formed using just the pick and place machinery and a grease dispenser device (or other form of fluid device). The locating pins 165 can be used to position the insulator plate 150 between a heat sink lid (e.g., heat sink lid 200 as in the example of FIG. 2) and the heat sink body 105. The locating pins 165 can be coupled with, formed on, or disposed on a surface (e.g., top surface, bottom surface) of the insulator plate 150. The locating pins 165 can have a variety of different shapes, such as but not limited to, a diamond shaped portion, rounded portion, octagonal shape, rectangular shape or square shape.

The insulator plate 150 can include an open inner region 170. The open inner region 170 can be arranged such that portions of other components of an invert module can be disposed within or through the open inner region 170 to provide additional cooling to the respective components. For example, portions of a capacitor, such as but not limited to, positive terminals or leads and negative terminals or leads, can be disposed within or extend through the open inner region 170. As the open inner region 170 of the insulator plate 150 can be disposed about, disposed around or otherwise surround the positive terminals or leads and negative terminals or leads of the capacitor, the open inner region 170 can provide active cooling to these components. The open inner region 170, in additional to other cooling components of the heat sink module 100, can reduce an inductance value of the inverter module and reduce EMI noise within the inverter module. For example, the design, shape, or geometry of the open inner region 170 can allow coolant fluid disposed within the heat sink module 100 to be positioned adjacent to, proximate to or otherwise closer to the positive terminals or leads and negative terminals or leads of the capacitor to provide active cooling. The width of the open inner region 170 can range from 10 mm to 20 mm (e.g., 12 mm). The length of the open inner region 170 can range from 140 mm to 160 mm (e.g., 150 mm). The height of depth of the inner region 170 can range from 3 mm to 15 mm (e.g., 4 mm, 8 mm). The width, length, or height of the open inner region 170 can vary within or outside these ranges.

Figure 2:
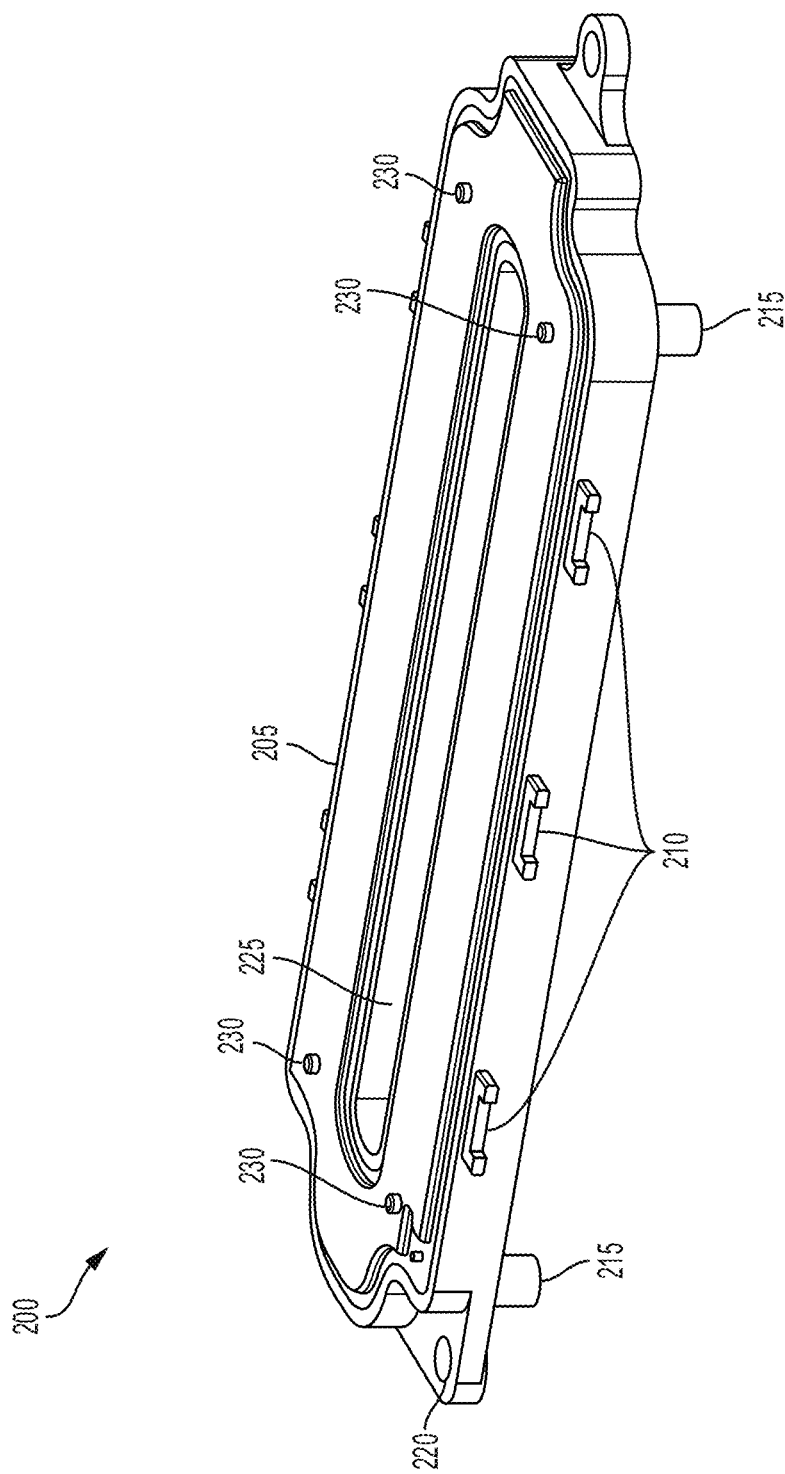
FIG. 2 depicts an example exploded view of a heat sink of an inverter module of a drive unit of an electric vehicle, showing of a bottom portion and an insulation plate of the heat sink, according to an illustrative implementation.

FIG. 2, among others depicts a heat sink lid 200 of the heat sink module 100. The heat sink lid 200 can couple with the insulator plate 130 and the heat sink body 105 to form the heat sink module 100. The heat sink lid 200 can have a length in a range from 200 mm to 225 mm (e.g., 215 mm). A height of the heat sink lid 200 can range from 5 mm to 15 mm (e.g., 10 mm). A width of the heat sink lid 200 can range from 50 mm to 60 mm (e.g., 52 mm). The length, the height, or the width of the heat sink lid 200 can vary within or outside these ranges. The heat sink lid 200 can include a variety of different materials, such as but not limited to, conductive material, metal material, metallic material or aluminum.

The heat sink lid 200 can include a lid body 205. The lid body 205 can form the housing or outer surface of the heat sink lid 200. The lid body 205 can include a variety of different materials, such as but not limited to, conductive material, metal material, metallic material or aluminum. The lid body 205 can have a length in a range from 200 mm to 225 mm (e.g., 215 mm). A height of the lid body 205 can range from 5 mm to 15 mm (e.g., 10 mm). A width of the lid body 205 can range from 50 mm to 60 mm (e.g., 52 mm). The length, the height, or the width of the lid body 205 can vary within or outside these ranges.

The lid body 205 can include a plurality of connection points 210. The connection points 210 can be formed on one or more surfaces of the lid body 205. For example, the connection points 210 can be formed on side surfaces of the lid body 205 to couple the lid body 205 with the heat sink body 105. The lid body 205 can include a single connection point 210 or multiple connection points 210. For example, the lid body 205 can include a first plurality of connection points 210 formed on a first side surface of the lid body 205 and a second plurality of connection points 210 formed on a second side surface of the lid body 205. The second side surface can be an opposite or opposing side surface as compared to the first side surface. The number of connection points 210 formed on the different surfaces of the lid body 205 can be selected to correspond to the number of connection points 210 formed on corresponding surfaces of the heat sink body 105. For example, the lid body 205 can have the same number of connection points 210 as the heat sink body 105. The connection points 210 can be formed from a variety of different materials, including but not limited to, plastic material or non-conductive material.

The lid body 205 can include a plurality of mounting feet 215 (e.g., mounting boss). The mounting feet 215 can include a variety of different materials, including but not limited to, plastic material or non-conductive material. The mounting feet 215 can couple with mounting holes or other forms of connection points of other components of an inverter module. For example, the mounting feet 215 can be arranged or positioned along a surface (e.g., bottom surface, top surface) of the lid body 205. The mounting feet 215 can extend perpendicular with respect to a surface (e.g., bottom surface, top surface) of the lid body 205 to couple with corresponding mounting holes formed in the heat sink body 105. The mounting feet 215 can have a round shape, circular shape, octagonal shape, or rectangular shape. The mounting feet 215 can have a threaded outer surface to couple with a threaded inner surface of, for example, mounting holes. The mounting feet 215 can have a smooth outer surface to couple with an inner surface of, for example, mounting holes. The mounting feet 215 can have a variety of different shapes, sizes or dimensions and the shape, size or dimensions of a particular mounting feet 215 can be selected based at least in part on the dimensions of the lid body 205 or the heat sink body 105. The lid body 205 can include a single mounting foot 215 or multiple mounting feet 215. For example, the number of mounting feet 215 can be selected to correspond to the number of connection points or mounting holes on other components of the inverter module, such as but not limited to, the heat sink body 105. For example, the number of mounting feet 215 formed on the lid body 205 can be the same as the number of mounting holes 120 formed on the heat sink body 105.

The lid body 205 can include a plurality of mounting holes 220. The mounting holes 220 can couple with, receive, engage, or secure the lid body 205 with mating parts (e.g., mounting feet) or connection points on other components of an inverter module, for example, the heat sink body 105 or a gel tray. The mounting holes 220 can couple with or secure a transistor locator (e.g., plastic IGBT locator) to the lid body 205 and thus, to the heat sink module 100 during a manufacture process. For example, the transistor locator can position one or more transistors within an inverter module and the transistor locator can be coupled with the heat sink module 100 through one or more mounting holes 220 during the installation of the transistors.

The mounting holes 220 may include holes, orifices, or hollow portions formed through one or more portions of the lid body 205. The mounting holes 220 can be formed completely though a portion of the lid body 205 or may be formed up to a certain depth into a surface of the lid body 205. The mounting holes 220 may include a threaded inner surface to receive or engage a threaded outer surface of a fastener, screw, bolt, or mounting feet. The mounting holes 220 may include a threaded inner surface to receive or engage a threaded outer surface of a fastener, screw, bolt, or mounting feet. The mounting holes 220 can have a round shape, circular shape, octagonal shape, or rectangular shape. The mounting holes 220 can have a variety of different shapes, sizes or dimensions and the shape, size or dimensions of a particular mounting hole 220 can be selected based at least in part on the dimensions of the lid body 205 or the heat sink body 105. The lid body 205 can include a single mounting hole 220 or multiple mounting holes 220. For example, the number of mounting holes 220 can be selected to correspond to the number of connection points or mounting feet of other components of the inverter module, such as but not limited to, the heat sink body 105 or a plastic locator. For example, the number of mounting holes 220 formed on the lid body 205 can be the same as the number of mounting feet or connection points formed on a plastic locator of an inverter module.

The heat sink lid 200 can include an open inner region 225. For example, the lid body 205 can have a hollow middle portion or aperture formed there through corresponding to the open inner region 225. The open inner region 225 can be arranged such that portions of other components of an inverter module can be disposed within or through the open inner region 225 to provide additional cooling to the respective components. For example, portions of a capacitor, such as but not limited to, positive terminals or leads and negative terminals or leads, can be disposed within or extend through the open inner region 225. As the open inner region 225 of the heat sink lid 205 can be disposed about, disposed around or otherwise surround the positive terminals or leads and negative terminals or leads of the capacitor, the open inner region 225 can provide active cooling to these components. The open inner region 225, in additional to other cooling components of the heat sink module 100, can reduce an inductance value of the inverter module and reduce EMI noise within the inverter module. For example, the design, shape, or geometry of the open inner region 225 can allow coolant fluid disposed within the heat sink module 100 to be positioned adjacent to, proximate to or otherwise closer to the positive terminals or leads and negative terminals or leads of the capacitor to provide active cooling. The open inner region 225 can have a width in a range from 10 mm to 20 mm (e.g., 12 mm). The length of the open inner region 225 can range from 140 mm to 160 mm (e.g., 150 mm). The height of depth of the inner region 225 can range from 3 mm to 15 mm (e.g., 4 mm, 8 mm). The width, length, or height of the open inner region 225 can vary within or outside these ranges. The open inner regions 125, 170, 225 for each for each of the heat sink body 105, the insulator plate 150, and lid body 205, respectively can have the same dimensions (e.g., width, length, height) or one or more of the open inner regions 125, 170, 225 of the heat sink body 105, the insulator plate 150, and lid body 205 can have one or more different dimensions.

The heat sink lid 200 can include at least one locating dowel 230. For example, the lid body 205 can include a single locating dowel 230 or multiple locating dowels 230. The locating dowels 230 can be used to position the heat sink lid 200. The locating dowels 230 can be used, for example, during a pick and place automation process, to increase an efficiency of the manufacture process. The locating dowels 230 can be used to reduce the amount of human interaction with a particular manufacture process and therefore, the heat sink module 100 can be formed using just the pick and place machinery. The locating dowels 230 can be used to position the heat sink lid 200 between a plurality of transistors and the heat sink body 105 within an inverter module. The locating dowels 230 can be coupled with, formed on, or disposed on a surface (e.g., top surface, bottom surface) of the lid body 205. The locating dowels 230 can have a variety of different shapes, such as but not limited to, a diamond shaped portion, rounded portion, octagonal shape, rectangular shape or square shape.

The heat sink lid 200 can include one or more recessed pockets to house, hold or disposed within a temperature sensor or temperature measuring device. For example, the temperature sensor can monitor or measure the temperature of electrical components of an inverter module, such as but not limited to, transistors, capacitors, or bus bars. The heat sink lid 200 can use one or more of locating dowels 230 to position the temperature sensor or temperature measuring device within the recessed pockets. For example, the locating dowels 230 can be formed on or coupled with an inner surface of the lid body 205 and be arranged to aid in positioning the temperature sensor or temperature measuring device within the recessed pockets.

The shape, geometry and dimensions of the heat sink module 100, and thus that shape of each of the heat sink lid 200, the insulator plate 150, and the heat sink body 105, can be formed to surround, be disposed about, or disposed around electrical components of an inverter module. The shape, geometry and dimensions of the heat sink module 100, and thus that shape of each of the heat sink lid 200, the insulator plate 150, and the heat sink body 105, can be optimized to create more surface area and provide greater cooling within an inverter module. For example, the heat sink module 100 can be disposed within an inverter module such that the heat sink lid 200, the insulator plate 150, and the heat sink body 105 surround, be disposed about, or disposed around positive terminals or leads of a capacitor coupled with transistors and negative terminals or leads of a capacitor coupled with transistors in an inverter module. The positive terminals or leads of the capacitor and the negative terminals or leads of the capacitor can extend through the open inner regions 225, 170, 125 of each of the heat sink lid 200, the insulator plate 150, and the heat sink body 105, respectively to position cool surfaces and coolant flowing through the heat sink module 100 closer to these electrical components. Thus, the heat sink lid 200, the insulator plate 150, and the heat sink body 105 can provide active cooling to each of the positive terminals or leads of a capacitor coupled with transistors and negative terminals or leads of a capacitor coupled with transistors in an inverter module to reduce inductance value in the inverter module and reduce EMI noise in the inverter module.

Figure 3:
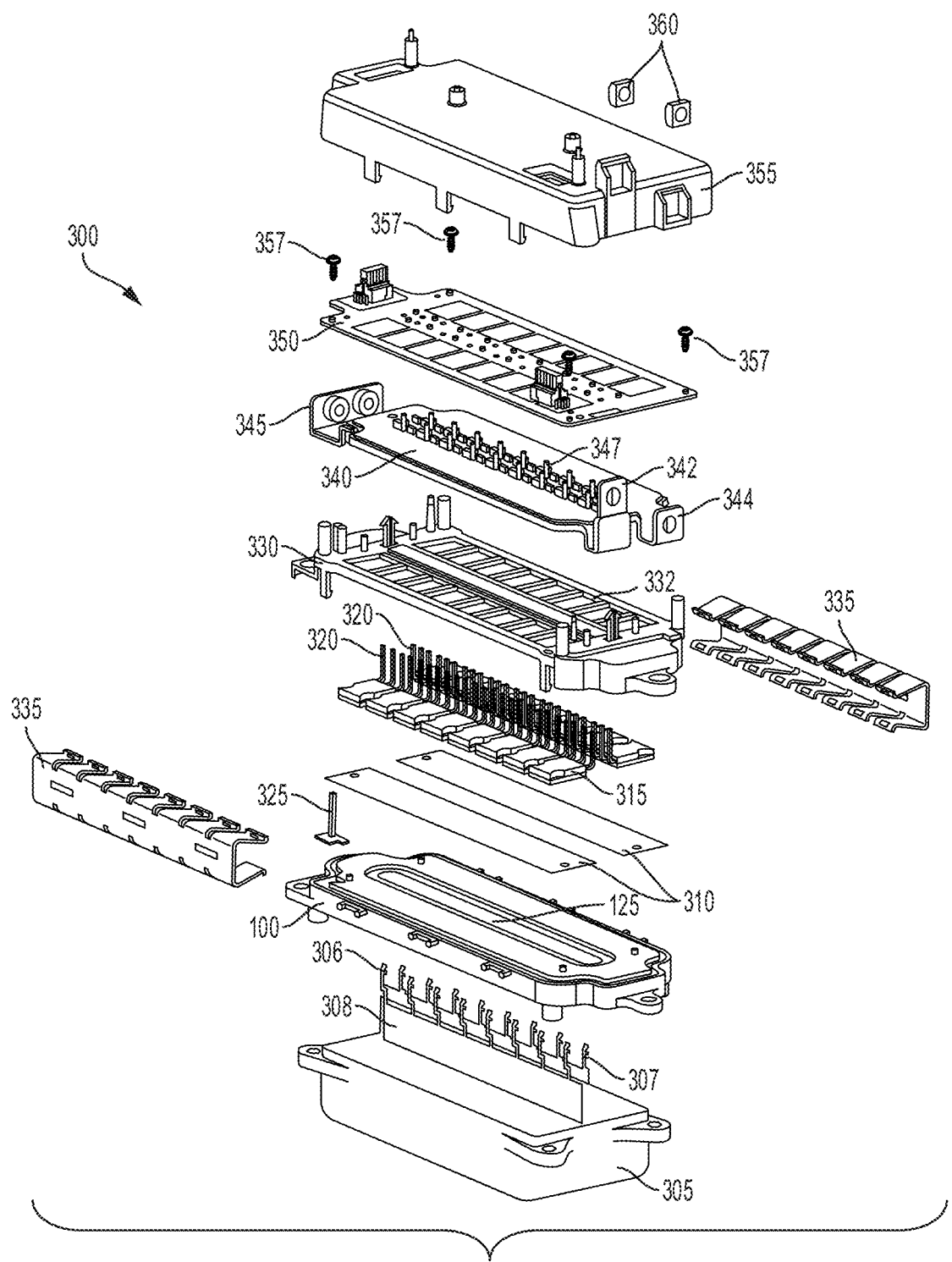
FIG. 3 is an example exploded view of a single phase power module of a multiple phase inverter module of a drive unit of an electric vehicle; according to an illustrative implementation.

FIG. 3, among others, depicts a cross-sectional view of a power module 300. The power module 300 can include a heat sink module 100 to provide active cooling to a capacitor (e.g., capacitor 305) and transistors (e.g., transistors 315) of the power module. The power module 300 can be one power module of a multiple phase inverter module (e.g., inverter module 450 as in the example of FIG. 4) disposed within a drive train unit of an electric vehicle (e.g., electric vehicle 405 as in the example of FIG. 4) to power the respective electric vehicle. For example, the power module 300 can couple with two other power modules 300 in a triplet configuration to form a three-phase inverter module (e.g., inverter module 450 as in the example of FIG. 4). Each of the power modules 300 can be formed having the same components and dimensions to provide inverter functionality based at least in part on the modular design (e.g., ease of assembly) and ability to be adapted for a variety of different inverter applications. The power module 300 can be formed having a length in a range from 220 mm to 230 mm. The power module 300 can be formed having a width in a range from 80 mm to 90 mm. The power module 300 can be formed having a height in a range from 60 mm to 70 mm. The dimensions and size of the power modules 300 described herein can vary outside these ranges.

As depicted in FIG. 3, the power module 300 can include at least one capacitor module 305 having a first surface (e.g., top surface) and a second surface (e.g., bottom surface). The capacitor module 305 can include DC-Link, Single-Phase Capacitors ("DCLSP Capacitors") used as X capacitors, DC-Link filtering capacitors or automotive, industrial, or commercial inverters. The capacitor module 305 can include a housing or outer surface that can be formed from a variety of different materials, including but not limited to, plastic material or non-conductive material. The dimensions of the capacitor module 305 can vary and can be selected based at least in part on the dimensions of the power module 300. For example, the capacitor module 305 can have a length in a range from 140 mm to 155 mm (e.g., 150 mm). The capacitor module 305 can have a width in a range from 60 mm to 70 mm (e.g., 66 mm). The capacitor module 305 can have a height in a range from 30 mm to 40 mm (e.g., 32 mm).

The capacitor module 305 can include terminals 306, 307 and a divider 308. The terminals 306, 307 can include positive terminals 306 and negative terminals 307. For example, positive terminals 306 can extend from or be coupled with a first side surface of the divider 308 and negative terminals 307 can extend from or be coupled with a second side surface of the divider 308. Thus, the divider 308 can be disposed or otherwise positioned to separate the positive terminals 306 from the negative terminals 307 of the capacitor module 305. The capacitor module 305 can include one or more capacitor elements (not shown) disposed within the capacitor module 305. For example, the capacitor module 305 can house a single capacitor film roll or multiple capacitor film rolls (e.g., three to four film rolls). The capacitor film rolls can be coupled with the positive terminals 306 and the negative terminals 307 through one or more tabs. The capacitor film rolls and thus the capacitor module 305 can have a capacitance value of 200-400 nanofarads (nF), e.g., 300 nF. The capacitance value can vary within or outside this range.

The positive terminals 306 can correspond to leads or terminals of a positive bus bar of the capacitor module 305. The negative terminals 307 can correspond to leads or terminals of a negative bus bar of the capacitor module 305. For example, the capacitor module 305 can include a positive bus bar and a negative bus bar, for example, disposed within the housing of the capacitor module 305. The positive terminals 306 can include leads, terminals or extensions of the positive bus bar that extend out of the capacitor module 305 to couple with leads of other components of the power module 300, such as but not limited to, transistors (e.g., leads 320 of transistors 315) of the power module 300. The negative terminals 307 can include leads, terminals or extensions of the negative bus bar that extend out of the capacitor module 305 to couple with leads of other components of the power module 300, such as but not limited to, transistors (e.g., leads 320 of transistors 315) of the power module 300.

The divider 308 can be disposed between the positive terminals 306 and the negative terminals 307 to electrically isolate or electrically insulate the positive terminals 306 and the negative terminals 307. The shape and dimensions of the divider 308 can vary and can be selected based at least in part on the shape and dimensions of the positive terminals 306 and the negative terminals 307. For example, a thickness or width of the divider 308 can be in a range from 0.5 mm to 1.5 mm. A length of the divider 308 can be in a range from 130 mm to 145 mm (e.g., 140 mm). A height of the divider 308 can be in a range from 20 mm to 30 mm (e.g., 25 mm). The thickness, width, length or height of the divider 308 can vary within or outside these ranges.

The power module 300 can include at least one heat sink module 100. The heat sink module 100 can include a first surface (e.g., top surface) and a second surface (e.g., bottom surface). The second surface of the heat sink module 100 can be coupled with, disposed over or otherwise in contact with the first surface of the capacitor module 305. For example, the positive terminals 306, the negative terminals 307, and the divider 308 can extend through an inner open region 125 of the heat sink module 100. The heat sink module 100 can provide active cooling to the capacitor module 305. For example, the heat sink module 100 can be disposed proximate to at least one surface, here the first surface (e.g., top surface) of the capacitor module 305 and the heat sink module 100 can provide active cooling to the first surface of the capacitor module 305. For example, the heat sink module 100 can have a shape that defines one or more cooling channels 130 formed within the heat sink module 100. The cooling channels 130 can receive and be shaped to allow coolant to flow through the heat sink module 100 such that the heat sink module 100 can provide active cooling to components and electronics (e.g., capacitor module 305, transistors 315) disposed proximate to surfaces of the heat sink module 100.

The heat sink module 100 can be disposed within the power module 300 such that the heat sink module 100 surrounds, is disposed about, or disposed around a portion of terminals 306, 307 of the capacitor module 305 that couple with transistors (e.g., transistors 315) of the power module 300. For example, the heat sink module 100 can include an open inner region 125 (e.g., hole, orifice) formed in a middle portion of the heat sink module 100. The capacitor module 305 can couple with the heat sink module 100 such that the divider 308, positive terminals 306, and negative terminals 307 extend through the open inner region 125 of the heat sink module 100. Thus, the heat sink module 100 can be positioned such that it surrounds surfaces of the divider 308, positive terminals 306, and negative terminals 307 to provide active cooling to the divider 308, positive terminals 306, negative terminals 307, and transistors 315. For example, in operation, the capacitor module 305 can generate heat and may not receive enough cooling (e.g., passive cooling, active cooling). The heat generation inside the capacitor module 305 can reduce the life of the respective capacitor module 305 if not properly dissipated. Thus, the heat sink module 100 can provide active cooling or passive cooling to enable the respective capacitor module 305 to dissipate the heat generated by the capacitor module 305. For example, the heat sink module 100 can be positioned such that cool surfaces and coolant flowing through the heat sink module 100 are disposed closer to these electrical components, for example, the capacitor module 100 and transistors 315. Thus, the heat sink module 100 can provide active cooling to each of the capacitor module 305, the positive terminals 306, the negative terminals 307 and transistors 315 of the power module 300 to reduce inductance value in the power module 300 and reduce EMI noise in the inverter module. The heat sink open inner region 125 can have a width in a range from 10 mm to 20 mm (e.g., 12 mm). The heat sink open inner region 125 can have a length in a range from 140 mm to 120 mm (e.g., 150 mm). The heat sink open inner region 125 can have a height (or depth) in a range from 3 mm to 15 mm (e.g., 4 mm, 8 mm). The width, length, or height of the heat sink open inner region 125 can vary within or outside these ranges.

The power module 300 can include one or more ceramic plates 310 coupled to, disposed over or otherwise in contact with the first surface of the heat sink module 100. For example, and as depicted in FIG. 3, the power module 300 can include first and second ceramic plates 310. Each of the first and second ceramic plates 310 can include a first surface (e.g., top surface) and a second surface (e.g., bottom surface). Each of the second surfaces of the first and second ceramic plates 310 can couple with, be disposed over or otherwise in contact with the first surface of the heat sink module 100. The ceramic plates 310 can insulate the heat sink module 100 from one or transistors (e.g., transistors 315) disposed within the power module 300. The ceramic plates 310 may include ceramic based material and can electrically insulate the heat sink module 100 from transistors (e.g., transistors 315) disposed within the power module 300. For example, the ceramic plates 310 can prevent a short circuit condition between the heat sink module 100 and the transistors (e.g., transistors 315) disposed within the power module 300. The ceramic plates 310 can have a length in a range from 100 mm to 250 mm. The ceramic plates 310 can have a width in a range from 40 mm to 55 mm. The ceramic plates 310 have a height (or thickness) in a range from 2 mm to 10 mm. The length, width, and height of the ceramic plates 310 can vary within or outside these ranges.

The power module 300 can include a plurality of transistors 315. The plurality of transistors 315 can couple with, be disposed over or otherwise in contact with the first surface of the ceramic plates 310. Each of the transistors 315 can include a plurality of leads 320. The transistors 315 can include discrete insulated-gate bipolar transistors (IGBT's), IGBT semiconductor dies, TO-247 transistors, or TO-247 discreet IGBT packages (e.g., TO-247 transistors, switches). Each of the transistors 315 can include one or more leads 320. For example, each of the transistors 315 may include three leads 320. Each of the three leads 320 can corresponds to at least one of the terminals of the transistor 315. For example, a first lead 320 can correspond to the base terminal or base lead. A second lead 320 can correspond to the collector terminal or collector lead. A third lead 320 can correspond to the emitter terminal or emitter lead. The leads 320 can have a generally straight or unbent shape. When the transistors 315 are fully coupled within the power module 300, the leads 320 can be bent, shaped or otherwise manipulated to couple with a respective one or more components (e.g., gate drive printed circuit board (PCB) 350, capacitor module 100) within the power module 300. For example, the leads 320 can be formed such that they extend perpendicular with respect to a first surface (e.g., top surface) of the transistors 315. For example, the leads 320 can be formed such that they have a bent shape and extend up with respect to a first surface (e.g., top surface) of the transistors 315.

The plurality of transistors 315 can be organized in a predetermined arrangement. For example, the plurality of transistors 315 can be disposed in one or more rows having multiple transistors 315 and the rows can be disposed such that the leads 320 of each of the transistors 315 are proximate to or adjacent to each other to allow for ease of coupling with components (e.g., gate drive PCB 160) of the power module 300. For example, a first plurality of transistors 315 can be arranged in a first row and a second plurality of transistors 315 can be arranged in a second row. Each of the rows of transistors 315 may include the same number of transistors or the rows of transistors 315 may include a different number of transistors 315. The transistors 315 in the same row can be positioned such that one or more side edges are in contact with a side edge of a single transistor 315 or two transistors 315 of the same row (e.g., one transistor 315 on each side). Thus, the transistors 315 can be arranged in a uniformed row along the first surface of the ceramic plates 310. The first plurality of transistors 315 can be spaced from the second plurality of transistors 315. The first plurality of transistors 315 can be evenly spaced or symmetrically from the second plurality of transistors 315 with respect to the first surface of the ceramic plates 310. For example, each of the transistors 315 in the first plurality of transistors 315 can be spaced the same distance from a corresponding transistor 315 of the second plurality of transistors 315. The first plurality of transistors 315 can be asymmetrically spaced from the second plurality of transistors 315 with respect to the first surface of the ceramic plates 310. For example, one or more of the transistors 315 in the first plurality of transistors 315 can be spaced different distances from corresponding transistors 315 of the second plurality of transistors 315. The one or more of the transistors 315 in the first plurality of transistors 315 can be spaced with respect to each other with a pitch (e.g., center to center spacing) in a range from 15 mm to 20 mm (e.g., 17.5 mm). The one or more of the transistors 315 in the second plurality of transistors 315 can be spaced with respect to each other with a pitch (e.g., center to center spacing) in a range from 15 mm to 20 mm (e.g., 17.5 mm). The one or more of the transistors 315 in the first plurality of transistors 315 can be spaced with respect to the one or more transistors 315 in the second plurality of transistors 315 in a range from 10 mm to 20 mm (e.g., 14 mm).

The power module 300 can include at least one temperature sensor 325 such as at least one transistor temperature sensing printed circuit board (PCB) 325. The transistor temperature sensing PCB 325 can include control electronics to communicate or monitor temperatures of different components of the power module 300, such as but not limited to transistors 315. For example, the transistor temperature sensing PCB 325 can be disposed proximate to the plurality of transistors 315 to provide temperature data corresponding to the plurality of transistors 315. For example, the transistor temperature sensing PCB 325 can be disposed between the ceramic plates 310 and the plurality of transistors 315 or between the heat sink 305 and the ceramic plates 310. The transistor temperature sensing PCB 325 can collect or retrieve temperature data corresponding to the plurality of transistors 315. The transistor temperature sensing PCB 325 can collect or retrieve temperature data corresponding to individual transistors 315, groups of transistors 315 or all of the plurality of transistors 315 collectively. For example, the temperature sensing can be extrapolated to predict IGBT junction temperatures. The transistor temperature sensing PCB 325 may be positioned such that it is compressed and sealed against a pocket of grease on the ceramic, adjacent to the transistors 315. For example, the transistor temperature sensing PCB 325 can be disposed a distance from the transistors 315 that ranges from 0 mm (e.g., in contact) to 2 mm. The distance between the transistor temperature sensing PCB 325 can vary outside these ranges.

The power module 300 can include a locator 330 (which can also be referred to herein as a locator guide or locator frame). The locator 330 can include a first surface (e.g., top surface) and a second surface (e.g., bottom surface). The second surface of the locator 330 can couple with, be disposed over or in contact with the first surface of the ceramic plates 310 or the heat sink 305. The locator 330 can include non-conductive material or plastic material. The locator 330 can have a length in a range from 200 mm to 225 mm (e.g., 215 mm). The locator 330 can have a height (e.g., thickness) in a range from 5 mm to 20 mm (e.g., 10 mm). The locator 330 can have a width in a range from 45 mm to 65 mm (e.g., 52 mm). The length, height, and width of the locator 330 can vary within and outside these ranges. The locator 330 can includes a plurality of slots 332 (e.g., apertures, holes, recesses) formed in a frame of the locator 330 to hold or couple various components of the power module 300 in place. The locator 330 can include the plurality of slots 332 to hold or couple with the transistors 315. At least on transistor 315 of the plurality of transistors 315 can be disposed or coupled with at least one slot 332 of the locator 330.

A plurality of clips 335 can couple the transistors 315 with the locator 330 (e.g., hold the transistors 315 in the slots 332 of the locator 330). For example, each of the plurality of transistors 315 can be disposed within at least one slot 332 of the locator 330 and the clips 335 can include spring clips that couple onto a side portion of the locator 330 and the transistors 315 to hold or compress the transistors 315 within a respective slot 332 to hold the transistors 315 in place and in contact with the locator 330. Fasteners 357 may be used to couple the transistors 315 with the locator 330. The locator 330 can include a plastic locator or plastic material.

The slots 332 of the locator 330 can include apertures, holes, recesses formed in a frame of the locator 330. The slots 332 can have varying shapes, sizes and dimensions and the shapes, sizes and dimensions of a particular slot 332 can be selected based at least in part on the shape, size or dimension of a component of the power module 300. For example, the locator 330 may include slots 332 for transistors 315, fasteners, clips, thermistors or thermal pads. The transistors slots have a generally rectangular shape which can be selected based on the particular transistor 315 to be used in the power module 300. The fastener slots can have a generally round shape and may include a threaded inner surface to couple with a threaded portion of a fastener. The thermistor slots can have a generally round shape. The power module 300 may include only one thermistor, thus only one thermistor slot may be used. However, two thermistor slots can be formed to provided symmetry and ease of manufacture. For example, having two thermistor slots can allow for the locator 330 to be rotated and a thermistor of the power module 300 can be disposed within either thermistor slot. The locator 330 can be formed having any number of slots 332, and the number of slots 332 can be selected based at least on the type of components of the power module 300. For example, the total number of slots 332 formed in the locator 330 can range from eight slots 332 to twenty four slots 332.

The locator 330 can operate as a guide or frame for a manufacture process of the power module 300, such as during a pick and place automation process, to increase an efficiency of the manufacture process. For example, the locator 330 can keep different components or parts of the power module 300 from moving around during manufacture resulting in a reducing an amount of fixturing (e.g., identifying and moving parts to correct locations) during the manufacture process. The power module 300 can be formed faster and more efficiently using the locator 330 as a guide for an automation device (e.g., pick and place automation machinery). The locator 330 can reduce the amount of human interaction with a particular manufacture process and therefore, the power module 300 can be formed using just the pick and place machinery and a grease dispenser device (or other form of fluid device).

The power module 300 can include a laminated bus bar 340. The laminated bus bar 340 can include a first surface (e.g., top surface) and a second surface (e.g., bottom surface). The second surface of the laminated bus bar 340 can couple with, be disposed over or in contact with the first surface of the locator 330 and portions of the first surface of the transistors 315 disposed in the slots 332 of the locator 330. The leads 320 of the transistors 315 can couple with portions of the laminated bus bar 340. For example, the laminated bus bar 340 can include a plurality of leads 347. Each of the plurality of leads 347 of the laminated bus bar 340 can couple with at least one lead 320 of the plurality of transistors 315. For example, at least two leads 345 of the laminated bus bar 340 can couple with at least two leads 320 of a transistor 315 of the plurality of transistors 315. The laminated bus bar 340 can have a length in a range from 200 mm to 225 mm. The laminated bus bar 340 can have a height (e.g., thickness) in a range from 5 mm to 20 mm. The laminated bus bar 340 can have a width in a range from 45 mm to 65 mm. The length, height, and width of the laminated bus bar 340 can vary within and outside these ranges. The laminated bus bar 340 can include or conductive material, such as but not limited to copper.

The laminated bus bar 340 can include includes two input terminals 342, 344 (e.g., positive input terminal and negative input terminal) disposed at or along a first side and an output terminal 345 disposed at a second, different side of the laminated bus bar 340. For example, the two input terminals 342, 344 can be disposed at an opposite or opposing side as compared to the output terminal 345. The first and second input terminals 342, 344 can include conductive material, such as but not limited to copper. The first and second input terminals 342, 344 can be formed in a variety of different shapes to accommodate coupling with an inverter bus bar (e.g., positive bus bar, negative bus bar). The first and second input terminals 342, 344 can have or include a straight shape, or a curved or bent shape. For example, the first and second input terminals 342, 344 can include a first portion that is parallel with respect to a first surface (e.g., top surface) of the laminated bus bar 340 and a second portion that is perpendicular with respect to the first surface of the laminated bus bar 340. The first input terminal 342 can couple with a positive inverter bus-bar (not shown) to receive a positive voltage and provide the positive voltage to the power module 300. The second input terminal 344 can couple with a negative bus-bar (not shown) to receive a negative voltage and provide the negative voltage to the power module 300. The first input terminal 342 can be disposed at a different level or height with respect to the side surface of the laminated bus bar 340 as compared with the second input terminal 344. For example, the first input terminal 342 can be disposed at first level or first height and the second input terminal 344 can be disposed at a second level or second height. The first level or first height can be greater than the second level or the second height. The first level or first height can be less than the second level or the second height.

The output terminal 345 can include conductive material, such as but not limited to copper. The output terminal 345 can be formed in a variety of different shapes to accommodate coupling with an inverter phase bus bar (not shown). The output terminal 345 can be formed having a straight shape, or a curved or bent shape. For example, the output terminal 345 can include a first portion that is parallel with respect to a first surface (e.g., top surface) of the laminated bus bar 340 and a second portion that is perpendicular with respect to the first surface of the laminated bus bar 340. The output terminal 345 can couple with a phase bus-bar (not shown) to provide power generated by the power module 300 to other electrical components of an electric vehicle.

The power module 300 can include a gate drive printed circuit board (PCB) 350. The gate drive PCB 350 can include a first surface (e.g., top surface) and a second surface (e.g., bottom surface). The second surface of gate drive PCB 350 can couple with, be disposed over or in contact with the first surface of the laminated bus bar 340. The gate drive PCB 350 can include control electronics to control one or more components of the power module 300 or communication electronics to communicate with and receive from or transmit signals to a control board of an inverter module. The gate drive PCB 350 can include control electronics and can generate and provide control signals to the transistors 315. For example, the leads 320 of the transistors 315 can extend through the locator 330 and the laminated bus bar 340 to couple with a portion or surface of the gate drive PCB 350. The gate drive PCB 350 can generate control signals, for example, to turn one or more of transistors 315 on or off, open or close. The gate drive PCB 350 can have a length in a range from 140 mm to 220 mm. The gate drive PCB 350 can have a height (e.g., thickness) in a range from 5 mm to 10 mm. The gate drive PCB 350 can have a width in a range from 60 mm to 100 mm. The length, height, and width of the gate drive PCB 350 can vary within and outside these ranges.

The power module 300 can include a dielectric gel tray 355. The dielectric gel tray 355 can include a first surface (e.g., top surface), a second surface (e.g., bottom surface) and can define an inner region that includes the second surface. The second surface of the dielectric gel tray 355 can couple with, be disposed over or contact the gate drive PCB 350. The dielectric gel tray 355 can couple with the capacitor module 100 though one or more fasteners 357. For example, the dielectric gel tray 355 can form a housing that is disposed over the gate drive PCB 350, laminated bus bar 340, locator 330, transistors 315, transistor temperature sensing PCB 325, the ceramic plates 310, the heat sink 305 such that that each of the gate drive PCB 350, laminated bus bar 340, locator 330, transistors 315, transistor temperature sensing PCB 325, the ceramic plates 310, and the heat sink 305 are disposed within the inner region defined by the dielectric gel tray 355 and thus covered by the dielectric gel tray 355 when the dielectric gel tray 355 is coupled with the capacitor module 100. For example, the dielectric gel tray 355 can include or be formed having an inner region that covers, submerges, or can be disposed about multiple components of the power module 300.

The dielectric gel tray 355 (e.g., potting compound container) can include poly carbon material, or other forms of high temperature plastic. The dielectric gel tray 355 can be formed using various injection molded techniques. The dielectric gel tray 355 can be disposed over one or more components of the power module 300 and operate as an insulator for the components (e.g., electronics) of the power module 300. The gel tray 355 can be formed having a length in a range from 160 mm to 240 mm. The gel tray 355 can be formed having a width in a range from 80 mm to 90 mm. The gel tray 355 can be formed having a height in a range from 40 mm to 60 mm. The dimensions and size of the gel tray 355 can vary within or outside these ranges.

The gel tray 355 includes one or more capacitive orifices 360. The capacitive orifices 360 can be used as inputs or outputs for the power module 300. For example, the capacitive orifices 360 can be formed as a hole or an access point to couple a power supply (e.g., DC power supply) to the power module 300. The gel tray 355 can include a first capacitive orifice 360 that couples the first input terminal 342 of the laminated bus bar 340 with a positive bus bar to provide a positive power supply to the power module 300. The gel tray 355 can include a second capacitive orifice 360 that couples the second input terminal 344 of the laminated bus bar 340 with a negative bus bar to provide a negative power supply to the power module 300. The gel tray 355 can include a third capacitive orifice 360 that couples the output terminal 345 of the laminated bus bar 340 with a phase bus bar to provide an output voltage generated by the power module 300 to other components of an electric vehicle. For example, capacitive orifices 360 can be formed as a hole or an access point to provide a power (e.g., voltage) generated by the power module 300 to other systems, such as a drive train unit of an electric vehicle.

Figure 4:
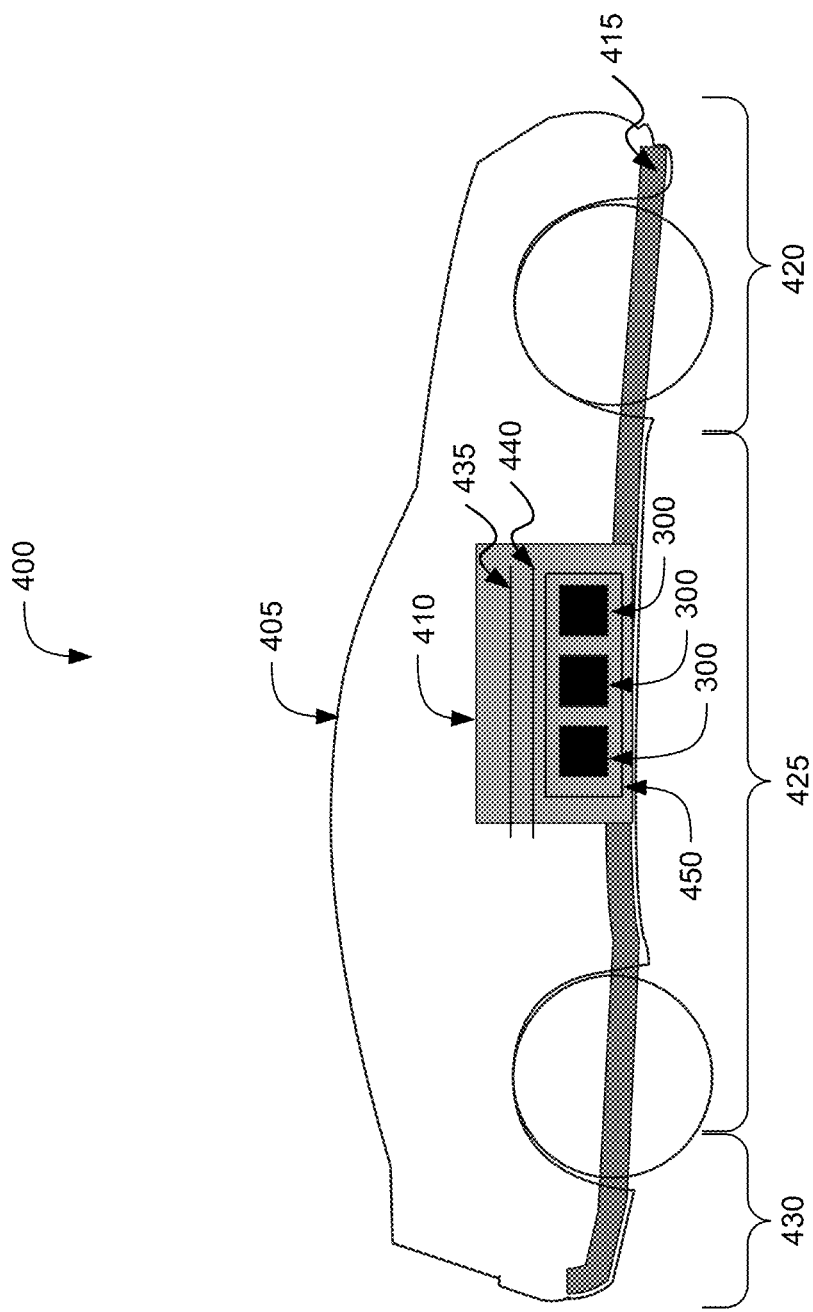
FIG. 4 is a block diagram depicting a cross-sectional view of an example electric vehicle installed with a battery pack.

FIG. 4 depicts an example cross-section view 400 of an electric vehicle 405 installed with a battery pack 410. The battery pack 410 can include an inverter module 450 having one or more power modules 300. Each of the power modules 300 can include at least one heat sink module 100 to provide cooling to electrical components within the respective power modules 300. For example, the inverter module 450 can include a three single phase power modules 300 each having at least one heat sink module 100 to form a three phase inverter module 450. The inverter module 450 can provide three phase power generated by the three power modules 300 to power the electric vehicle 405. The battery pack 410 can correspond to a drive train unit 410 of the electric vehicle 405. For example, the battery pack 410 can be disposed within or be a component of a drive train unit 410. The drive train unit 410 (and the battery pack 410) can provide power to the electric vehicle 405. For example, the drive train unit 410 may include components of the electric vehicle 405 that generate or provide power to drive the wheels or move the electric vehicle 405. The drive train unit 410 can be a component of an electric vehicle drive system. The electric vehicle drive system can transmit or provide power to different components of the electric vehicle 405. For example, the electric vehicle drive train system can transmit power from the battery pack 410 or drive train unit 410 to an axle or wheels of the electric vehicle 405.

The electric vehicle 405 can include an autonomous, semi-autonomous, or non-autonomous human operated vehicle. The electric vehicle 405 can include a hybrid vehicle that operates from on-board electric sources and from gasoline or other power sources. The electric vehicle 405 can include automobiles, cars, trucks, passenger vehicles, industrial vehicles, motorcycles, and other transport vehicles. The electric vehicle 405 can include a chassis 415 (e.g., a frame, internal frame, or support structure). The chassis 415 can support various components of the electric vehicle 405. The chassis 415 can span a front portion 420 (e.g., a hood or bonnet portion), a body portion 425, and a rear portion 430 (e.g., a trunk portion) of the electric vehicle 405. The front portion 420 can include the portion of the electric vehicle 405 from the front bumper to the front wheel well of the electric vehicle 405. The body portion 425 can include the portion of the electric vehicle 405 from the front wheel well to the back wheel well of the electric vehicle 405. The rear portion 430 can include the portion of the electric vehicle 405 from the back wheel well to the back bumper of the electric vehicle 405.

The battery pack 410 that includes at least one power module 300 having at least one heat sink module 100 can be installed or placed within the electric vehicle 405. The battery pack 410 can include or couple with a power converter component. For example, the power converter component can include the inverter module 400 having three phase power module 405. The battery pack 410 can be installed on the chassis 415 of the electric vehicle 405 within the front portion 420, the body portion 425 (as depicted in FIG. 4), or the rear portion 430. The battery pack 410 can couple with a first bus-bar 435 and a second bus-bar 440 that are connected or otherwise electrically coupled with other electrical components of the electric vehicle 405 to provide electrical power from the battery pack 410. For example, each of the power modules 300 can couple with the first bus-bar 435 and the second bus bar 440 to provide electrical power from the battery pack 410 to other electrical components of the electric vehicle 405.

Figure 5:
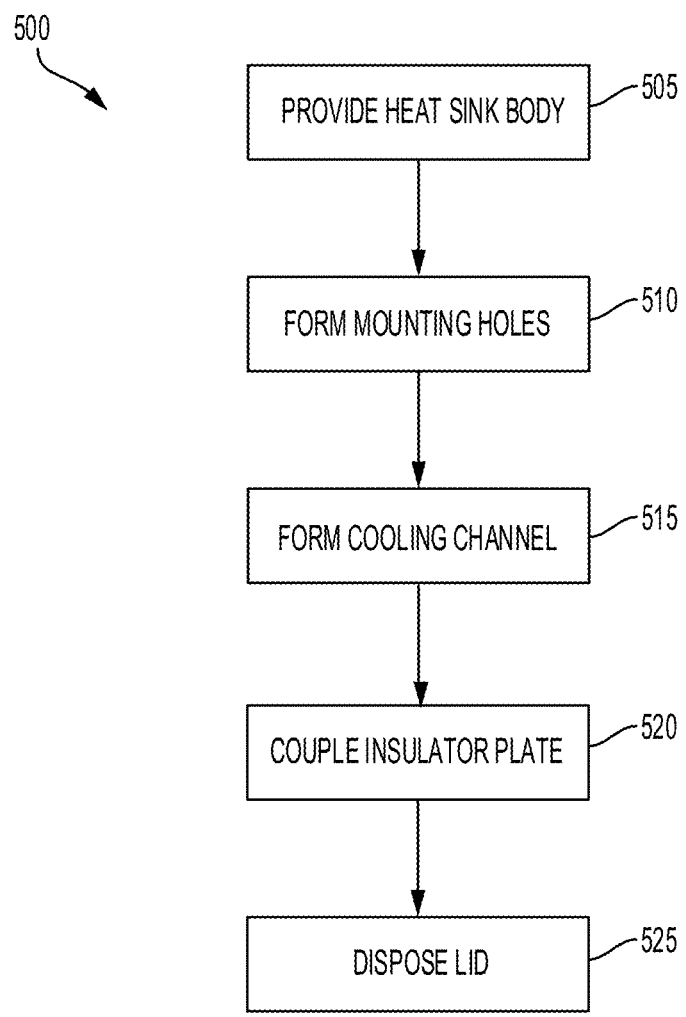
FIG. 5 depicts a flow diagram of an example method of forming a heat sink module of an inverter module of an electric vehicle, according to an illustrative implementation.

FIG. 5, among others, depicts a method 500 for providing a heat sink module 100 of an inverter module 450 to power an electric vehicle 405. For example, at least one heat sink module 100 can be disposed within each power module 300 that are coupled together to form the inverter module 450. The method 500 can include providing a heat sink body 105 (ACT 505). For example, the method 500 can include providing a heat sink body 105 of a heat sink module 100. The heat sink body 105 can be formed using materials, such as but not limited to, conductive material, metal material, metallic material or aluminum. The heat sink body 105 can form the base of the heat sink module 100. For example, providing the heat sink body 105 can include forming one or more mounting feet 115 on a second surface (e.g., bottom surface) of the heat sink body 105. The mounting feet 115 can couple with other components of a power module 300, such as but not limited to, a capacitor module. The heat sink body 105 can be formed having a plurality of connection points 110. The connection points 110 can be formed on an outer surface of the heat sink body 105. The connection points 110 can be formed on side surfaces of the heat sink body 105 to couple the lid body 205 with the connection points 210 formed on the lid body 205.

The method 500 can include forming mounting holes 120 (ACT 510). For example, the method 500 can include forming a plurality of mounting holes 120, a fluid inlet 135 and a fluid outlet 135 in the heat sink body 105. One or more holes, orifices, or apertures can be formed on the heat sink body 105 to form the mounting holes 120. The mounting holes 120 can be formed completely though a portion of the heat sink body 105 or may be formed up to a certain depth into a surface of the heat sink body 105. The mounting holes 120 can be formed having a threaded inner surface to receive or engage a threaded outer surface of a fastener, screw, bolt, or mounting feet. For example, the mounting holes 120 can couple with, receive, engage, or secure the heat sink body 105 with mating parts (e.g., mounting feet) or connection points on other components of an inverter module, for example, of a heat sink lid 200. At least one fluid inlet 135 can be formed in the heat sink body 105. For example, an orifice can be formed through a surface of the heat sink body 105 to receive or provide fluids to one or more cooling channels 130. The heat sink body 105 can include a single fluid inlet 135 or multiple fluid inlets 135. At least one fluid outlet 135 can be formed in the heat sink body 105. For example, an orifice can be formed through a surface of the heat sink body 105 to release or discharge fluids from one or more cooling channels 130. The heat sink body 105 can include a single fluid outlet 135 or multiple fluid outlets 135. The heat sink body 105 may include one orifice that operates as both a fluid inlet 135 and a fluid outlet 135.

The method 500 can include forming cooling channels 130 (ACT 515). For example, the method 500 can include forming one or more cooling channels 130 in the heat sink body 105. The cooling channels 130 can be fluidly coupled with the fluid inlet 135 and the fluid outlet 135. The cooling channel 130 can form an interior of the heat sink body 105. For example, the cooling channel 130 can be formed by creating a hollow region within the heat sink body 105. The heat sink body 105 can be formed having a "U" shape or oval shape and the cooling channel 130 can correspond to an interior region of the "U" shaped or oval shaped heat sink body 105. The cooling channel 130 can be formed such that it extends a length of the heat sink body 105. The cooling channel 130 can hold or contain fluid, such as coolant, to provide active cooling to other components of an inverter module, such as but not limited to, a capacitor or transistors.

Forming cooling channels 130 can include forming a single cooling channel 130 or forming multiple cooling channels 130 (e.g., two or more cooling channels 130). For example, a first cooling channel 130 can be formed and a second cooling channel 130 can be formed. Forming cooling channels 130 can include fluidly coupling the first cooling channel 130 with the second cooling channel 130 such that the first cooling channel 130 and the second cooling channel 130 form one cooling channel and refer to portions or regions of the single cooling channel 130 are disposed parallel with respect to each other. The cooling channel 130 or cooling channels 130 can be fluidly coupled with the fluid inlet 135 to receive fluid, such as, but not limited to, coolant fluid. The cooling channel 130 or cooling channels 130 can be fluidly coupled with the fluid outlet 135 to release or discharge fluid, such as, but not limited to, coolant fluid.

The method 500 can include coupling an insulator plate 150 (ACT 520). For example, the method 500 can include coupling an insulator plate 150 with the heat sink body 105. The insulator plate 150 can have a first surface and a second surface. The first surface can correspond to a cooling surface 155. The second surface of the insulator plate 150 can couple with a joining surface 145 of the heat sink body 105 and seal the one or more cooling channels 130. The insulator 150 can be disposed over the joining surface 145 of the heat sink body to couple the insulator 150 with the heat sink body 105. The insulator plate 150 can correspond to a top surface of the cooling channel 130. Coupling an insulator plate 150 can include forming at least one locating pin 165 on the insulator plate 150. For example, a single locating pin 165 or multiple locating pins 165 can be formed on the insulator plate 150 to aid in a manufacturing process of the heat sink module 100. The insulator plate 150 can couple with a locator during, for example, a pick and place automation process, using the locating pin 165. The locator can use the locating pin 165 to position the insulator plate 150 during the manufacturing process. The locating pins 165 can be used to position the insulator plate 150 between a heat sink lid (e.g., heat sink lid 200 as in the example of FIG. 2) and the heat sink body 105. The locating pins 165 can be coupled with, formed on, or disposed on a surface (e.g., top surface, bottom surface) of the insulator plate 150.

The method 500 can include disposing a lid 200 (ACT 525). For example, the method 500 can include disposing a heat sink lid 200 over the first surface of the insulator plate 150. The heat sink lid 200 can include a plurality of mounting feet 215 to couple with the mounting holes 120 of the heat sink body 105 to secure the heat sink lid 200 to the heat sink body 105. The heat sink lid 200 can be formed using materials, such as but not limited to, conductive material, metal material, metallic material or aluminum. The heat sink lid 200 can be formed having a lid body 205. The lid body 205 can form the housing or outer surface of the heat sink lid 200. The lid body 205 can include a plurality of connection points 210. For example, disposing a lid 200 can include forming a plurality of connection points 210 on an outer surface of the heat sink lid 200 and forming a plurality of connection points 110 on an outer surface of the heat sink body 105. The connection points 210 can be formed on side surfaces of the lid body 205 to couple the lid body 205 with the connection points 110 formed on the heat sink body 105.

Disposing a lid 200 can include forming a plurality of mounting feet 215 (e.g., mounting boss). The mounting feet 215 can be formed from materials, including but not limited to, plastic material or non-conductive material. The mounting feet 215 can couple with mounting holes or other forms of connection points of other components of an inverter module. For example, the mounting feet 215 can be formed extending perpendicular with respect to a surface (e.g., bottom surface, top surface) of the lid body 205 to couple with corresponding mounting holes formed in the heat sink body 105. Disposing a lid 200 can include forming a plurality of mounting holes 220 on the lid body 205. The mounting holes 220 can couple with, receive, engage, or secure the lid body 205 with mating parts (e.g., mounting feet) or connection points on other components of an inverter module, for example, the heat sink body 105 or a gel tray. Disposing a lid 200 can include forming at least one locating dowel 230 (or locating pin) on the lid body 205. For example, the lid body 205 can include a single locating dowel 230 or multiple locating dowels 230. The locating dowels 230 can be used to position the heat sink lid 200 during a pick and place automation process, to increase an efficiency of the manufacture process. The locating dowels 230 can be used to reduce the amount of human interaction with a particular manufacture process and therefore, the heat sink module 100 can be formed using just the pick and place machinery. The locating dowels 230 can be used to position the heat sink lid 200 between a plurality of transistors and the heat sink body 105 within an inverter module. The locating dowels 230 can be coupled with, formed on, or disposed on a surface (e.g., top surface, bottom surface) of the lid body 205. The locating dowels 230 can have a variety of different shapes, such as but not limited to, a diamond shaped portion, rounded portion, octagonal shape, rectangular shape or square shape.

The heat sink module 100 can be formed in a top down fashion. For example, the components of the heat sink module 100 can be designed such that the sub-components (e.g., lid 200, insulator plate 150, heat sink body 105) can be assembled in a top down fashion or assembled individually to provide for streamlined installation and a simpler manufacturing process. For example, the components of the heat sink module 100 can be manufacture and installed in a vertical direction. As each component of the heat sink module 100 is modular, each of the lid 200, insulator plate 150, and heat sink body 105 can be manufactured, produced or tested before moving on to a next step of assembly.

The heat sink lid 200, the heat sink body 105 and the insulator plate 150 can be manufactured separately or manufactured together. The heat sink lid 200, the heat sink body 105 and the insulator plate 150 can be coupled with each other using various techniques, such as but not limited to welding or brazing processes. The heat sink lid 200 and heat sink body 105 can be die casted or formed using a metal casting process. The shape of the heat sink module 100, and thus that shape of each of the heat sink lid 200, the insulator plate 150, and the heat sink body 105, can be formed to surround, be disposed about, or disposed around electrical components of an inverter module. For example, the heat sink module 100 can be disposed within an inverter module such that the heat sink lid 200, the insulator plate 150, and the heat sink body 105 surround, be disposed about, or disposed around positive terminals or leads of a capacitor coupled with transistors and negative terminals or leads of a capacitor coupled with transistors in an inverter module. The positive terminals or leads of the capacitor and the negative terminals or leads of the capacitor can extend through the open inner regions 225, 170, 125 of each of the heat sink lid 200, the insulator plate 150, and the heat sink body 105, respectively to position cool surfaces and coolant flowing through the heat sink module 100 closer to these electrical components. Thus, the heat sink lid 200, the insulator plate 150, and the heat sink body 105 can provide active cooling to each of the positive terminals or leads of a capacitor coupled with transistors and negative terminals or leads of a capacitor coupled with transistors in an inverter module to reduce inductance value in the inverter module and reduce EMI noise in the inverter module.

Providing the heat sink module 100 can include disposing a heat sink module 100 in an inverter module 450 of a drive train unit of an electric vehicle 405. For example, at least one heat sink module 100 can be disposed within a power module 300. One or more power modules 300 can be disposed within an inverter module 450 of a drive train unit. For example, three power modules 300, each having at least one heat sink module 100, can be coupled together in a triplet configuration and disposed within an inverter module 450 to form a three phase inverter module 450. The inverter module 450 can be disposed within a drive train unit or a battery pack 410 of an electric vehicle 405. The drive train unit or the battery pack 410 can include a single inverter module 450 or multiple inverter modules 300. Providing the heat sink module 100 can include providing the heat sink module 100 in an inverter module 450 of a drive train unit or battery pack 410. The drive train unit, having the inverter module 450, or the battery pack 410, having the inverter module 450, can be provided in the electric vehicle 405.

Figure 6:
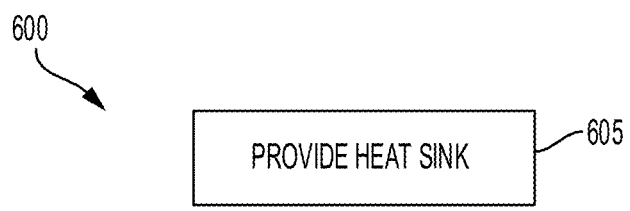
FIG. 6 depicts a flow diagram of an example method of providing a heat sink module of an inverter module of an electric vehicle, according to an illustrative implementation.

FIG. 6, among others, depicts a method 600 for providing a heat sink module 100 of an inverter module 450 to power an electric vehicle 405. The method 600 can include providing a heat sink 100 (ACT 605). For example, the method 600 can include providing a heat sink module 100 of an inverter module 450 to power an electric vehicle 405. The heat sink module 100 can include a heat sink body 105 having a plurality of mounting holes 120, a fluid inlet 135 and a fluid outlet 135. The heat sink module 100 can include a cooling channel 130 formed in the heat sink body 105. The cooling channel 130 can be fluidly coupled with the fluid inlet 135 and the fluid outlet 135. The heat sink module 100 can include an insulator plate 150 coupled with the heat sink body 105. The insulator plate 150 can have a first surface and a second surface. The second surface of the insulator plate 150 can couple with a joining surface 145 of the heat sink body 105 to seal the cooling channel 130. The heat sink module 100 can include a heat sink lid 200 disposed over the first surface of the insulator plate 150. The heat sink lid 200 can include a plurality of mounting feet 215 to couple with the mounting holes 120 of the heat sink body 105 to secure the heat sink lid 200 to the heat sink body 105.

While acts or operations may be depicted in the drawings or described in a particular order, such operations are not required to be performed in the particular order shown or described, or in sequential order, and all depicted or described operations are not required to be performed. Actions described herein can be performed in different orders.

Having now described some illustrative implementations, it is apparent that the foregoing is illustrative and not limiting, having been presented by way of example. Features that are described herein in the context of separate implementations can also be implemented in combination in a single embodiment or implementation. Features that are described in the context of a single implementation can also be implemented in multiple implementations separately or in various sub-combinations. References to implementations or elements or acts of the systems and methods herein referred to in the singular may also embrace implementations including a plurality of these elements, and any references in plural to any implementation or element or act herein may also embrace implementations including only a single element. References in the singular or plural form are not intended to limit the presently disclosed systems or methods, their components, acts, or elements to single or plural configurations. References to any act or element being based on any act or element may include implementations where the act or element is based at least in part on any act or element.

The phraseology and terminology used herein is for the purpose of description and should not be regarded as limiting. The use of "including" "comprising" "having" "containing" "involving" "characterized by" "characterized in that" and variations thereof herein, is meant to encompass the items listed thereafter, equivalents thereof, and additional items, as well as alternate implementations consisting of the items listed thereafter exclusively. In one implementation, the systems and methods described herein consist of one, each combination of more than one, or all of the described elements, acts, or components.

Any references to implementations or elements or acts of the systems and methods herein referred to in the singular can include implementations including a plurality of these elements, and any references in plural to any implementation or element or act herein can include implementations including only a single element. References in the singular or plural form are not intended to limit the presently disclosed systems or methods, their components, acts, or elements to single or plural configurations. References to any act or element being based on any information, act or element may include implementations where the act or element is based at least in part on any information, act, or element.

Any implementation disclosed herein may be combined with any other implementation or embodiment, and references to "an implementation," "some implementations," "one implementation" or the like are not necessarily mutually exclusive and are intended to indicate that a particular feature, structure, or characteristic described in connection with the implementation may be included in at least one implementation or embodiment. Such terms as used herein are not necessarily all referring to the same implementation. Any implementation may be combined with any other implementation, inclusively or exclusively, in any manner consistent with the aspects and implementations disclosed herein.

References to "or" may be construed as inclusive so that any terms described using "or" may indicate any of a single, more than one, and all of the described terms. References to at least one of a conjunctive list of terms may be construed as an inclusive OR to indicate any of a single, more than one, and all of the described terms. For example, a reference to "at least one of 'A' and 'B'" can include only 'A', only 'B', as well as both 'A' and 'B'. Such references used in conjunction with "comprising" or other open terminology can include additional items.

Where technical features in the drawings, detailed description or any claim are followed by reference signs, the reference signs have been included to increase the intelligibility of the drawings, detailed description, and claims. Accordingly, neither the reference signs nor their absence have any limiting effect on the scope of any claim elements.

Modifications of described elements and acts such as variations in sizes, dimensions, structures, shapes and proportions of the various elements, values of parameters, mounting arrangements, use of materials, colors, orientations can occur without materially departing from the teachings and advantages of the subject matter disclosed herein. For example, elements shown as integrally formed can be constructed of multiple parts or elements, the position of elements can be reversed or otherwise varied, and the nature or number of discrete elements or positions can be altered or varied. Other substitutions, modifications, changes and omissions can also be made in the design, operating conditions and arrangement of the disclosed elements and operations without departing from the scope of the present disclosure.

The systems and methods described herein may be embodied in other specific forms without departing from the characteristics thereof. For example the voltage across terminals of battery cells can be greater than 5V. The foregoing implementations are illustrative rather than limiting of the described systems and methods. Scope of the systems and methods described herein is thus indicated by the appended claims, rather than the foregoing description, and changes that come within the meaning and range of equivalency of the claims are embraced therein.

Systems and methods described herein may be embodied in other specific forms without departing from the characteristics thereof. For example, descriptions of positive and negative electrical characteristics may be reversed. For example, elements described as negative elements can instead be configured as positive elements and elements described as positive elements can instead by configured as negative elements. Further relative parallel, perpendicular, vertical or other positioning or orientation descriptions include variations within +/−10% or +/−10 degrees of pure vertical, parallel or perpendicular positioning. References to "approximately," "about" "substantially" or other terms of degree include variations of +/−10% from the given measurement, unit, or range unless explicitly indicated otherwise. Coupled elements can be electrically, mechanically, or physically coupled with one another directly or with intervening elements. Scope of the systems and methods described herein is thus indicated by the appended claims, rather than the foregoing description, and changes that come within the meaning and range of equivalency of the claims are embraced therein.

What is claimed is:

1. A heat sink module of an inverter module to power an electric vehicle, comprising: a heat sink body having a plurality of mounting holes, a fluid inlet and a fluid outlet; a cooling channel formed in the heat sink body; the cooling channel fluidly coupled with the fluid inlet and the fluid outlet; an insulator plate coupled with the heat sink body; the insulator plate having a first surface and a second surface; an open inner region formed in the insulator plate; the second surface of the insulator plate couples with a joining surface of the heat sink body to seal the cooling channel, the insulator plate forming a top surface of the cooling channel; a heat sink lid disposed over the first surface of the insulator plate; and the heat sink lid to couple with the mounting holes of the heat sink body to secure the heat sink lid to the heat sink body.

2. The heat sink module of claim 1, comprising:
a plurality of connection points formed on an outer surface of the heat sinks lid.

3. The heat sink module of claim 1, comprising:
a plurality of connection points formed on an outer surface of the heat sink body.

4. The heat sink module of claim 1, comprising:
a plurality of locating pins coupled with a first surface of the heat sink lid.

5. The heat sink module of claim 1, comprising:
a plurality of locating pins coupled with the first surface of the insulator plate.

6. The heat sink module of claim 1, comprising:
a plurality of mounting holes formed in the heat sink lid.

7. The heat sink module of claim 1, comprising:
an open inner region formed in the heat sink lid.

8. The heat sink module of claim 1, comprising:
an open inner region formed in the heat sink body.

9. The heat sink module of claim 1, comprising:
the first surface of the insulator plate having a cooling surface, the cooling surface coupled with the heat sink lid.

10. The heat sink module of claim 1, comprising:
the heat sink module disposed in an inverter module of a drive train unit, the drive train unit having multiple inverter modules.

11. The heat sink module of claim 1, comprising:
the heat sink module disposed in an inverter module of a drive train unit, the drive train unit disposed in an electric vehicle.

12. A method of providing a heat sink module of an inverter module to power an electric vehicle, the method comprising: providing a heat sink body of a heat sink module; forming a plurality of mounting holes, a fluid inlet and a fluid outlet in the heat sink body; forming a cooling channel in the heat sink body, the cooling channel fluidly coupled with the fluid inlet and the fluid outlet; coupling an insulator plate with the heat sink body, the insulator plate having a first surface and a second surface, the first surface corresponding to a cooling surface and the second surface of the insulator plate to couple with a joining surface of the heat sink body and seal the cooling channel, the insulator plate forming a top surface of the cooling channel; forming an open inner region in the insulator plate; and disposing a heat sink lid over the first surface of the insulator plate, the heat sink lid to couple with the mounting holes of the heat sink body to secure the heat sink lid to the heat sink body.

13. The method of claim 12, comprising:
forming a plurality of connection points on an outer surface of the heat sink lid; and
forming a plurality of connection points on an outer surface of the heat sink body.

14. The method of claim 12, comprising:
coupling a plurality of locating pins with a first surface of the heat sink lid; and
coupling a plurality of locating pins with the first surface of the insulator plate.

15. The method of claim 12, comprising:
forming a plurality of mounting holes in the heat sink lid.

16. The method of claim 12, comprising:
disposing the heat sink module in an inverter module of a drive train unit, the drive train unit having multiple inverter modules.

17. The method of claim 12, comprising:
providing the heat sink module in an inverter module of a drive train unit; and
providing the drive train unit in an electric vehicle.

18. An electric vehicle, comprising: a heat sink module for an inverter module of an electric vehicle, the heat sink module comprising: a heat sink body having a plurality of mounting holes, a fluid inlet and a fluid outlet; a cooling channel formed in the heat sink body; the cooling channel fluidly coupled with the fluid inlet and the fluid outlet; an insulator plate coupled with the heat sink body; the insulator plate having a first surface and a second surface; an open inner region formed in the insulator plate; the second surface of the insulator plate couples with a joining surface of the heat sink body to seal the cooling channel, the insulator plate forming a top surface of the cooling channel; a heat sink lid disposed over the first surface of the insulator plate; and the heat sink lid to couple with the mounting holes of the heat sink body to secure the heat sink lid to the heat sink body.

* * * * *